US011139802B1

(12) United States Patent
Marfatia et al.

(10) Patent No.: US 11,139,802 B1
(45) Date of Patent: Oct. 5, 2021

(54) SEQUENTIAL BASED RING OSCILLATOR

(71) Applicant: QUALCOMM Incorporated, San Diego, CA (US)

(72) Inventors: Percy Tehmul Marfatia, Bangalore (IN); David Kidd, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/930,187

(22) Filed: Jul. 15, 2020

(51) Int. Cl.
*H03K 3/03* (2006.01)
*H03K 5/133* (2014.01)
*H03L 7/099* (2006.01)
*H01L 21/66* (2006.01)

(52) U.S. Cl.
CPC .......... *H03K 3/0315* (2013.01); *H01L 22/34* (2013.01); *H03K 5/133* (2013.01); *H03L 7/0995* (2013.01)

(58) Field of Classification Search
CPC .... H01L 22/34; H03K 3/0315; H03K 3/0322; H03K 5/133; H03L 7/0995
See application file for complete search history.

(56) References Cited

U.S. PATENT DOCUMENTS

| | | | |
|---|---|---|---|
| 6,075,418 A * | 6/2000 | Kingsley | G01R 31/31725 327/265 |
| 6,452,459 B1 * | 9/2002 | Chan | G11C 29/028 324/617 |
| 2002/0079943 A1 * | 6/2002 | Dubey | G06F 1/08 327/291 |
| 2008/0116964 A1 * | 5/2008 | Kernahan | H03H 11/265 327/538 |
| 2014/0354340 A1 * | 12/2014 | Kadam | H03K 3/0315 327/299 |
| 2015/0226800 A1 * | 8/2015 | Kim | G01R 31/31725 702/79 |
| 2016/0124045 A1 * | 5/2016 | Manohar | H03K 3/0315 324/617 |
| 2017/0307668 A1 * | 10/2017 | Buffa | H03K 3/0315 |

OTHER PUBLICATIONS

Ribas R., et al., "Ring Oscillators for Functional and Delay Test of Latches and Flip-Flops", Proceedings—SBCCI2011 24th Symposium on Integrated Circuits and Systems Design. 10.1145/2020876.2020893, 2011, 7 Pages.

* cited by examiner

*Primary Examiner* — Levi Gannon
(74) *Attorney, Agent, or Firm* — Loza & Loza, LLP

(57) ABSTRACT

A ring oscillator is disclosed according to certain aspects of the present disclosure. The ring oscillator include N flip-flops, each of the N flip-flops having a data input, a clock input, and an output, wherein N is an integer greater than 1. In certain aspects, the output of each of the N flip-flops is coupled to the clock input of an adjacent other one of the N flip-flops, the output of each of the N flip-flops is coupled to a reset input or a preset input of a non-adjacent other one of the N flip-flops, and the data input of each of the N flip-flops is coupled to a voltage line or a ground line.

28 Claims, 14 Drawing Sheets

US 11,139,802 B1

SEQUENTIAL BASED RING OSCILLATOR

BACKGROUND

Field

Aspects of the present disclosure relate generally to process monitoring, and more particularly, to a sequential based ring oscillator for process monitoring.

Background

Process variations can cause performance variations in digital circuits. The process variations may be across a chip, chip-to-chip, wafer-to-wafer, and/or lot-to-lot. Accordingly, it is important to measure performance variations in digital circuits across process variations (e.g., process corners).

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a ring oscillator. The ring oscillator includes N flip-flops, each of the N flip-flops having a data input, a clock input, and an output, wherein N is an integer greater than 1. The output of each of the N flip-flops is coupled to the clock input of an adjacent other one of the N flip-flops, the output of each of the N flip-flops is coupled to a reset input or a preset input of a non-adjacent other one of the N flip-flops, and the data input of each of the N flip-flops is coupled to a voltage line or a ground line.

A second aspect relates to a method for measuring performance using a ring oscillator, wherein the ring oscillator includes N flip-flops, each of the N flip-flops having a data input coupled to a voltage line or a ground line, wherein N is an integer greater than 1. The method includes routing an output signal of each of the N flip-flops to a clock input of an adjacent other one of the N flip-flops. The method also includes routing the output signal of each of the N flip-flops to a reset input or a preset input of a non-adjacent other one of the N flip-flops.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Process variations can cause performance variations in digital circuits. The process variations may be across a chip, chip-to-chip, wafer-to-wafer, and/or lot-to-lot. Accordingly, it is important to measure performance variations in digital circuits across process variations (e.g., process corners). The measurements may be used, for example, to correct timing issues in digital circuits caused by the process variations, improve product yield, etc.

To measure performance variations due to process variations, each chip may include one or more process monitors integrated on the chip. Each process monitor may be configured to measure the performance of a digital circuit on the chip that is sensitive to process variation. For example, each process monitor may include a ring oscillator configured to measure the performance of one or more standard cells on the chip. A standard cell may be a cell with a layout defined in a standard cell library and may include an inverter, a buffer, a NAND gate, a NOR gate, a complex gate (e.g., AN-OR-Invert (AOI) gate), an XOR gate, etc. The chip may include various standard cells and multiple instances of one or more standard cells, which may be interconnected to form more complex digital circuits on the chip.

Figure 1:
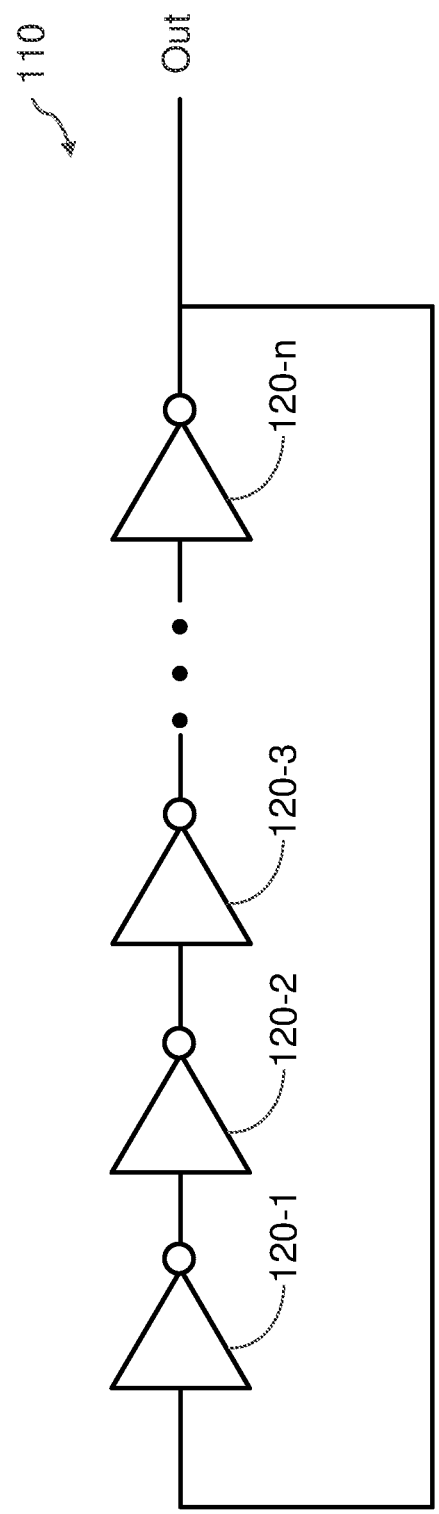
FIG. 1 shows an example of a ring oscillator including inverters according to certain aspects of the present disclosure.

FIG. 1 shows an example of a ring oscillator 110 on a chip configured to measure the delays of inverters 120-1 to 120-n. The inverters 120-1 to 120-n may be multiple instances of an inverter cell defined in a standard cell library. In this example, the ring oscillator 110 includes the inverters 120-1 to 120-n. The inverters 120-1 to 120-n are coupled in series in which the output of the last inverter 120-n is coupled to the input of the first inverter 120-1 to form a loop that oscillates at an oscillation frequency. The oscillation frequency of the ring oscillator 110 depends on the delays of the inverters 120-1 to 120-n. The shorter the delays, the higher the oscillation frequency. Thus, the oscillation frequency of the ring oscillator 110 may be used to measure the delays of the inverters 120-1 to 120-n. The oscillation frequencies of multiple ring oscillators (e.g., multiple instances of the ring oscillator 110) may be measured at multiple chips to determine delay variations of the inverter cell across process corners.

Ring oscillators may also be formed with other standard cells to measure performance variations of the other standard cells due to process variations. Standard cells currently covered by ring oscillators include inverter cells, buffer cells, NAND gate cells, NOR gate cells, complex gate cells (e.g., AOI gate cells), and XOR gate cells. However, sequential logic cells (e.g., flip-flop cells) are not currently covered by ring oscillators. As a result, ring oscillators are not currently used to measure performance (e.g., clock-to-Q delay) variations of sequential logic cells (e.g., flip-flop cells).

A challenge with using a conventional ring oscillator to measure the delays of flip-flop cells is that a conventional ring oscillator is formed using cells (e.g., inverter cells) that respond to both rise and fall transitions at their inputs in order to induce oscillations in the ring oscillator. However, a flip-flop typically responds to only one transition (rise transition or fall transition) at its clock input. As a result, flip-flops connected in a conventional ring oscillator will not oscillate, and therefore will not generate an oscillation frequency for measuring the delays of the flip-flops.

To address this, aspects of the present disclosure provide sequential based ring oscillators including flip-flops coupled in a loop. As discussed further below, oscillation in the sequential based ring oscillator is achieved by using reset inputs and/or preset inputs of the flip-flops in addition to the clock inputs of the flip-flops to generate both rising edges and falling edges in the ring oscillator.

Figure 2:
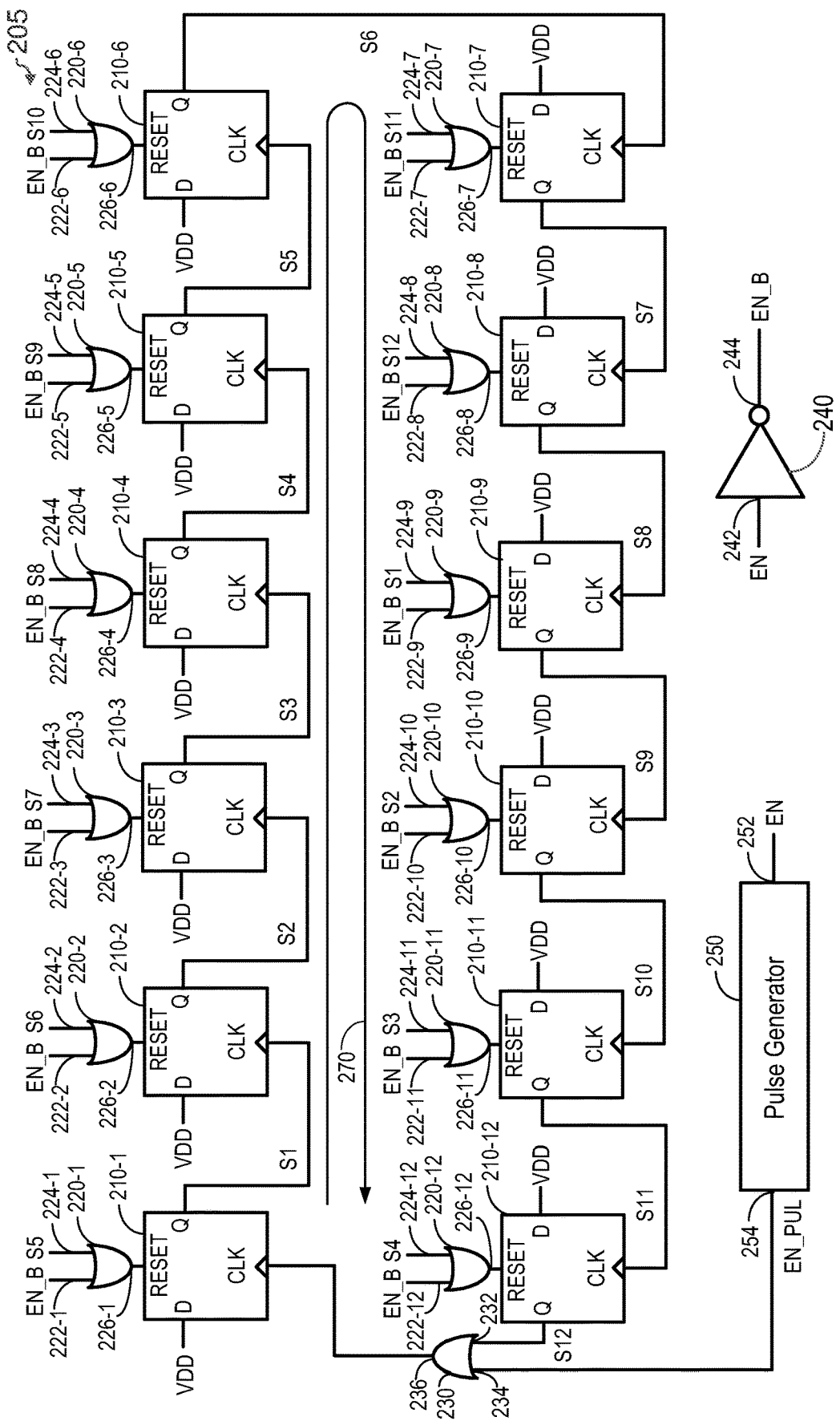
FIG. 2 shows an example of a sequential based ring oscillator according to certain aspects of the present disclosure.

FIG. 2 shows an example of a sequential based ring oscillator 205 according to certain aspects of the present disclosure. The sequential based ring oscillator 205 includes multiple flip-flops 210-1 to 210-12 coupled in a loop. In certain aspects, the flip-flops 210-1 to 210-12 may be multiple instances of a flip-flop cell defined in a standard cell library. As discussed further below, reset inputs of the flip-flops 210-1 to 210-12 are used to generate falling edges in the ring oscillator 205 to enable oscillation of the ring oscillator 205.

In this example, each flip-flop 210-1 to 210-12 has a data input (labeled "D"), a clock input (labeled "CLK"), an output (labeled "Q"), and a reset input (labeled "RESET"). Each flip-flop 210-1 to 210-12 is configured to latch the logic value at the respective data input D in response to a rising edge at the respective clock input CLK and output the latched logic value at the respective output Q. In this example, the time delay between a rising edge at the clock input CLK of a flip-flop and the appearance of the corresponding latched logic value at the respective output Q is referred to as the clock-to-Q delay. As discussed further below, the ring oscillator 205 may be used to measure the clock-to-Q delays (e.g., average clock-to-Q delay) of the flip-flops 210-1 to 210-12.

In this example, the clock input CLK of each flip-flop 210-1 to 210-12 is a positive-edge-triggered clock input in that the flip-flop latches the logic value at the respective data input D on a rising clock edge. However, it is to be appreciated that the present disclosure is not limited to this example, as discussed further below. Also, the output Q of each flip-flop 210-1 to 210-12 is a non-inverting output in that the latched logic value is not inverted at the output Q. However, it is to be appreciated that the present disclosure is not limited to this example, as discussed further below. In the example in FIG. 2, the data input D of each flip-flop 210-1 to 210-12 is coupled to a supply voltage line VDD, which corresponds to a logic one. As a result, each flip-flop 210-1 to 210-12 latches a one in response to a rising edge at the respective clock input CLK, and outputs the latched one at the respective output Q. However, it is to be appreciated that the present disclosure is not limited to this example, as discussed further below.

Each flip-flop 210-1 to 210-12 is configured to reset the respective output Q to zero when a one is input to the respective reset input. Each flip-flop 210-1 to 210-12 is configured to de-assert (i.e., release) the reset when a zero is input to the respective reset input.

In the example in FIG. 2, the output Q of each flip-flop 210-1 to 210-12 is coupled to the clock input CLK of an adjacent flip-flop 210-1 to 210-12 in the ring oscillator 205. In this example, the output Q of flip-flop 210-1 is coupled to the clock input CLK of flip-flop 210-2, the output Q of flip-flop 210-2 is coupled to the clock input CLK of flip-flop 210-3, the output Q of flip-flop 210-3 is coupled to the clock input CLK of flip-flop 210-4, and so forth. The output Q of flip-flop 210-12 is coupled to the clock input CLK of flip-flop 210-1 via a logic gate 230 to close the loop of the ring oscillator 205, as discussed further below. Although twelve flip-flops 210-1 to 210-12 are shown in the example in FIG. 2, it is to be appreciated that the present disclosure is not limited to this example. In general, the ring oscillator 205 includes N number of flip-flops coupled in a loop where N is an integer greater than 1 that can be less than twelve, equal to twelve, or greater than twelve.

The ring oscillator 205 may also include the logic gate 230, a pulse generator 250, and an inverter 240. The logic gate 230 has a first input 232, a second input 234, and an output 236. In the example in FIG. 2, the logic gate 230 is implemented with an OR gate. The first input 232 of the logic gate 230 is coupled to the output Q of flip-flop 210-12 and the output 236 of the logic gate 230 is coupled to the clock input CLK of flip-flop 210-1. When the ring oscillator 205 is enabled, the logic gate 230 passes a rising edge from the output Q of flip-flop 210-12 to the clock input CLK of flip-flop 210-1, as discussed further below.

The pulse generator 250 has an input 252 and an output 254. The input 252 is configured to receive an enable signal EN and the output 254 is coupled to the second input 234 of the logic gate 230. The pulse generator 250 is configured to generate a pulse signal EN_PUL in response to a rising edge of the enable signal EN and output the generated pulse signal EN_PUL at the output 254. As discussed further below, the pulse signal EN_PUL is used to trigger oscillation of the ring oscillator 205 when the ring oscillator 205 is first enabled by the enable signal EN. The inverter 240 is configured to receive the enable signal EN at input 242, generate enable signal EN_B by inverting the enable signal EN, and output the enable signal EN_B at output 244. In this example, the enable signal EN_B is the complement of the enable signal EN.

In the example in FIG. 2, the ring oscillator 205 also includes multiple logic gates 220-1 to 220-12. Each logic gate 220-1 to 220-12 has a first input 222-1 to 222-12, a second input 224-1 to 224-12, and an output 226-1 to 226-12. The output 226-1 to 226-12 of each logic gate 220-1 to 220-12 is coupled to the reset input of a respective one of the flip-flops 210-1 to 210-12. The first input 222-1 to 222-12 of each logic gate 220-1 to 220-12 is coupled to the output 244 of the inverter 240 to receive the enable signal EN_B. For ease of illustration, the individual connections between the output 244 of the inverter 240 and the logic gates 220-1 to 220-12 are not explicitly shown in FIG. 2. In the example in FIG. 2, each logic gate 220-1 to 220-2 is implemented with an OR gate. However, it is to be appreciated that the present disclosure is not limited to this example, as discussed further below.

In FIG. 2, the outputs of the flip-flops 210-1 to 210-12 are labeled S1 to S12, respectively. In this example, the output S1 to S12 of each flip-flop 210-1 to 210-12 is coupled to the reset input of a respective non-adjacent flip-flop 210-1 to 210-12 via the second input 224-1 to 224-12 of the corresponding logic gate 220-1 to 220-12. For example, the output S5 of flip-flop 210-5 is coupled to the reset input of respective non-adjacent flip-flop 210-1 via the second input 224-1 of logic gate 220-1, the output S6 of flip-flop 210-6 is coupled to the reset input of respective non-adjacent flip-flop 210-2 via the second input 224-2 of logic gate 220-2, and so forth. In the example in FIG. 2, the output S1 to S12 of each flip-flop 210-1 to 210-12 is separated from the respective non-adjacent flip-flop by three other flip-flops in the loop path of the ring oscillator 205. For example, the output S5 of flip-flop 210-5 is separated from the respective non-adjacent flip-flop 210-1 by flip-flops 210-2 to 210-4, the output S6 of flip-flop 210-6 is separated from the respective non-adjacent flip-flop 210-2 by flip-flops 210-3 to 210-5, and so forth. As discussed further below, the separation between the output of each flip-flop 210-1 to 210-12 and the respective non-adjacent flip-flop controls the duty cycle of the ring oscillator 205.

Exemplary operations of the ring oscillator 205 will now be described according to certain aspects.

The ring oscillator 205 is disabled when the enable signal EN is zero. In this case, the enable signal EN_B output by the inverter 240 to the logic gates 220-1 to 220-12 is one since the enable signal EN_B is the inverse (i.e., complement) of the enable signal EN. This causes each logic gate 220-1 to 220-12 to output a one to the reset input of the respective flip-flop 210-1 to 210-12. As a result, each flip-flop 210-1 to 210-12 is in the reset state and outputs a zero at the respective output Q.

To enable the ring oscillator 205, the enable signal EN is asserted in which the enable signal EN transitions from zero to one and the enable signal EN_B transitions from one to zero. The transition of the enable signal EN_B to zero causes each logic gate 220-1 to 220-12 to output a zero to the reset input of the respective flip-flop 210-1 to 210-12. As a result, the reset state at each flip-flop 210-1 to 210-12 is de-asserted (i.e., released).

In addition, the pulse generator 250 generates a pulse signal EN_PUL in response to the transition of the enable signal EN from zero to one (i.e., in response to the rising edge of the enable signal EN). In certain aspects, the pulse generator 250 may generate the pulse signal EN_PUL after a short delay from the rising edge of the enable signal EN to give flip-flop 210-1 time to de-assert the reset state. The logic gate 230 passes the pulse signal EN_PUL to the clock input CLK of flip-flop 210-1 to trigger oscillation.

Figure 3:
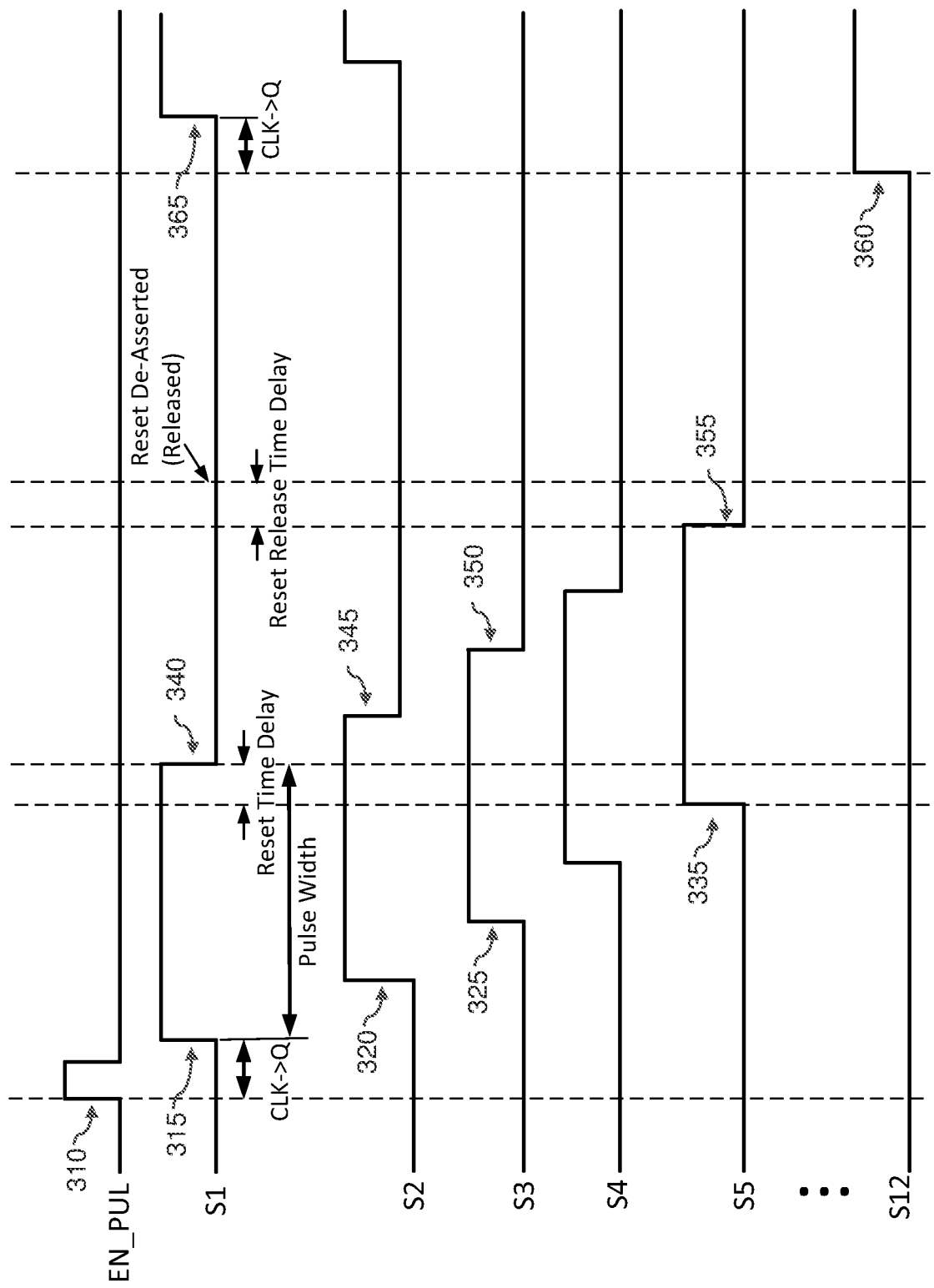
FIG. 3 is a timing diagram showing exemplary signals in the sequential based ring oscillator of FIG. 2 according to certain aspects of the present disclosure.

FIG. 3 is a timing diagram showing an example of the pulse signal EN_PUL at the clock input CLK of flip-flop 210-1. FIG. 3 also shows an example of the output signals S1 to S5 of flip-flops 210-1 to 210-5 and the output signal S12 of flip-flop 210-12. The output signals S6 to S11 of flip-flops 210-6 to 210-11 are not shown in FIG. 3 for ease of illustration.

In this example, the rising edge 310 of the pulse signal EN_PUL causes flip-flop 210-1 to latch the one (i.e., VDD) at the respective data input D and output the latched one at the respective output S1 after the clock-to-Q delay (CLK->Q) of flip-flop 210-1. This produces rising edge 315 at the output S1 of flip-flop 210-1, which is input to the clock input CLK of flip-flop 210-2. The rising edge 315 causes flip-flop 210-2 to latch the one (i.e., VDD) at the respective data input D and output the latched one at the respective output S2 after the clock-to-Q delay of flip-flop 210-2. This produces rising edge 320 at the output S2 of flip-flop 210-2, which is input to the clock input CLK of flip-flop 210-3. The rising edge 320 causes flip-flop 210-3 to latch the one (i.e., VDD) at the respective data input D and output the latched one at the respective output S3 after the clock-to-Q delay of flip-flop 210-3. This produces rising edge 325 at the output S3 of flip-flop 210-3, which is input to the clock input CLK of flip-flop 210-4. This process continues along the loop of the ring oscillator 205 causing the outputs of the flip-flop 210-1 to 210-12 to sequentially transition from zero to one in the direction 270 indicated in FIG. 2.

The rising edge 335 of the output signal S5 of flip-flop 210-5 causes flip-flop 210-1 to reset. This is because the output signal S5 of flip-flop 210-5 is coupled to the reset input of flip-flop 210-1 via the second input 224-1 of logic gate 220-1. In this example, the reset of flip-flop 210-1 causes the output S1 of flip-flop 210-1 to transition from one to zero, resulting in falling edge 340. The falling edge 340 at output S1 is delayed from the rising edge 335 at output S5 by the reset time delay of flip-flop 210-1, as shown in FIG. 3.

The rising edge (not shown) at the output S6 of flip-flop 210-6 causes flip-flop 210-2 to reset, resulting in falling edge 345 at the output S2 of flip-flop 210-2. Similarly, the rising edge (not shown) at the output S7 of flip-flop 210-7 causes flip-flop 210-3 to reset, resulting in falling edge 350 at the output S3 of flip-flop 210-3. This process continues along the loop of the ring oscillator 205 causing the outputs of the flip-flop 210-1 to 210-12 to sequentially transition from one to zero in the direction 270. Thus, the reset inputs of the flip-flops 210-1 to 210-12 are used to generate falling edges in the ring oscillator 205, which complement the rising edges generated using the clock inputs CLK of the flip-flops 210-1 to 210-12, enabling the ring oscillator 205 to oscillate.

The falling edge 355 at the output S5 of flip-flop 210-5 causes the reset state at flip-flop 210-1 to de-assert (i.e., release) after a reset release time delay of flip-flop 210-1. The release from the reset state prepares flip-flop 210-1 for the next rising edge at the respective clock input CLK. In this example, the next rising edge comes from the rising edge 360 at the output S12 of flip-flop 210-12. This is because the logic gate 230 passes the rising edge 360 at the output S12 of flip-flop 210-12 to the clock input CLK of flip-flop 210-1. The rising edge 360 causes flip-flop 210-1 to latch the one (i.e., VDD) at the respective data input D and output the latched one at the respective output S1 after the clock-to-Q delay (CLK->Q) of flip-flop 210-1. This produces rising edge 365 at the output S1 of flip-flop 210-1, which is input to the clock input CLK of flip-flop 210-2.

The above process repeats while the enable signal EN is high. This causes the output of each flip-flop 210-1 to 210-12 to oscillate while the enable signal EN is high. In this example, the clock inputs CLK of the flip-flops 210-1 to 210-12 are used to generate rising edges (i.e., rise transitions) in the ring oscillator 205 during oscillation and the reset inputs of the flip-flops 210-1 to 210-12 are used to generate falling edges (i.e., fall transitions) in the ring oscillator 205 during oscillation. In this example, oscillation of the ring oscillator 205 is triggered by the pulse signal EN_PUL. Once triggered by the pulse signal EN_PUL, the ring oscillator 205 may continue to oscillate while the enable signal EN is high.

The oscillation frequency of the ring oscillator 205 depends on the clock-to-Q (CLK->Q) delays of the flip-flops 210-1 to 210-12. The shorter the clock-to-Q delays, the higher the oscillation frequency of the ring oscillator 205. Thus, an average of the clock-to-Q delays of the flip-flops 210-1 to 210-12 may be measured by measuring the oscillation frequency of the ring oscillator 205. The oscillation frequency of the ring oscillator 205 may be measured, for example, using a frequency counter, as discussed further below.

In the example in FIG. 2, the output of each flip-flop 210-1 to 210-12 is separated from the reset input of the respective non-adjacent flip-flop by three other flip-flops in the loop path of the ring oscillator 205. For example, the output S5 of flip-flop 210-5 is separated from the reset input of respective non-adjacent flip-flop 210-1 by flip-flops 210-2 to 210-4. However, it is to be appreciated that the present disclosure is not limited to this example. In certain aspects, the output of each flip-flop may be separated from the reset input of the respective non-adjacent flip-flop by two or more other ones of the flip-flops in the ring oscillator 205.

The duty cycle of the ring oscillator 205 depends on the number of flip-flops separating the output of each flip-flop 210-1 to 210-12 from the reset input of the respective non-adjacent flip-flop. The greater the number of flip-flops separating the output of each flip-flop 210-1 to 210-12 from the reset input of the respective non-adjacent flip-flop, the higher the duty cycle of the ring oscillator 205. Thus, the number of flip-flops separating the output of each flip-flop 210-1 to 210-12 from the reset input of the respective non-adjacent flip-flop may be chosen to set the duty cycle of the ring oscillator 205. In one example, the number of flip-flops separating the output of each flip-flop 210-1 to 210-12 from the reset input of the respective non-adjacent flip-flop may be chosen such that the duty cycle of the ring oscillator 205 is between 30% to 40%. This may be done to ensure a healthy duty cycle that meets timing requirements of the flip-flops 210-1 to 210-12 and the ring oscillator 205.

During oscillation, when a flip-flop in the ring oscillator 205 is reset to transition the output of the flip-flop from one to zero, the flip-flop may need to be released from the reset state before the next rising edge at the respective clock input CLK. An example of this is shown in FIG. 3, in which flip-flop 210-1 is released from the reset state (i.e., reset de-asserted) before the next rising edge 360 at the respective clock input CLK, where the next rising edge 360 is provided by the output S12 of flip-flop 210-12. If the reset state of a flip-flop is not released before the next rising edge at the respective clock input CLK, then the flip-flop may fail to transition from zero to one on the next rising edge.

In the example illustrated in FIG. 3, when each flip-flop 210-1 to 210-12 transitions from zero to one, the flip-flop is released from the reset state after a time duration approximately equal to two pulse widths, where a pulse width is a duration that the output of a flip-flop is one. Thus, in this example, the duty cycle of the ring oscillator 205 may be set to a duty cycle of less than 50% to help ensure that each flip-flop 210-1 to 210-12 is released from the reset state before the next rising edge at the respective clock input CLK. This may be achieved, for example, by choosing the number of flip-flops separating the output of each flip-flop 210-1 to 210-12 from the reset input of the respective non-adjacent flip-flop to be less than N/2 (e.g., approximately equal to N/3), where N is the number of flip-flops 210-1 to 210-12 in the ring oscillator 205. In the example in FIG. 2, N is equal to twelve. However, as pointed out earlier, the present disclosure is not limited to this example. In general, N may be less than twelve, equal to twelve, or greater than twelve.

Figure 4A:
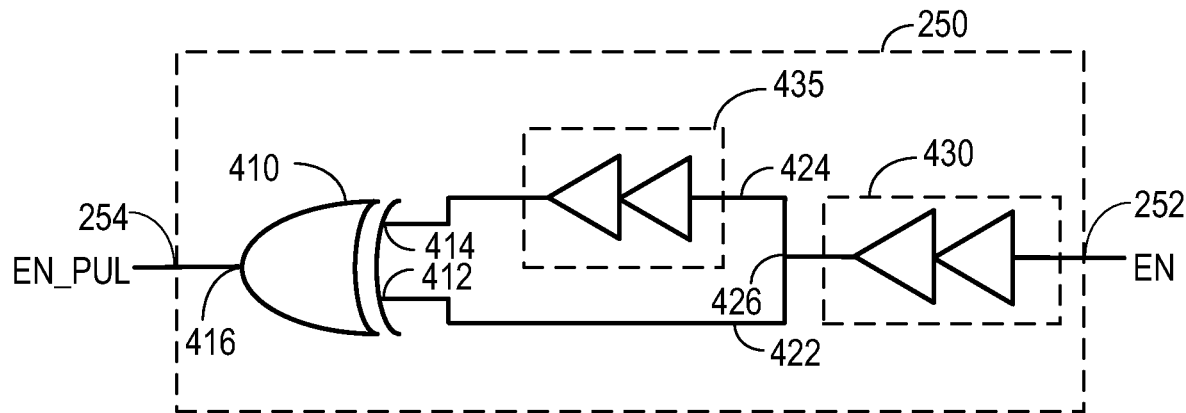
FIG. 4A shows an exemplary implementation of a pulse generator according to certain aspects of the present disclosure.

FIG. 4A shows an exemplary implementation of the pulse generator 250 according to certain aspects of the present disclosure. In this example, the pulse generator 250 includes a first delay circuit 430, a first path 422, a second path 424, and an exclusive OR gate 410. The exclusive OR gate 410 has a first input 412, a second input 414, and an output 416 coupled to the output 254 of the pulse generator 250. The first path 422 is coupled between node 426 and the first input 412 of the exclusive OR gate 410, and the second path 424 is coupled between node 426 and the second input 414 of the exclusive OR gate 410. The first delay circuit 430 is coupled between the input 252 of the pulse generator 250 and node 426. Thus, the first path 422 is coupled to the input 252 via the first delay circuit 430 and the second path 424 is coupled to the input 252 via the first delay circuit 430. The first delay circuit 430 may include one or more delay elements (also referred to as delay buffers).

The second path 424 includes a second delay circuit 435 to provide a time delay between the second path 424 and the first path 422. As discussed further below, this time delay controls the width of the pulse signal EN_PUL generated by the pulse generator 250. The second delay circuit 435 may include one or more delay elements (also referred to as delay buffers).

Figure 4B:
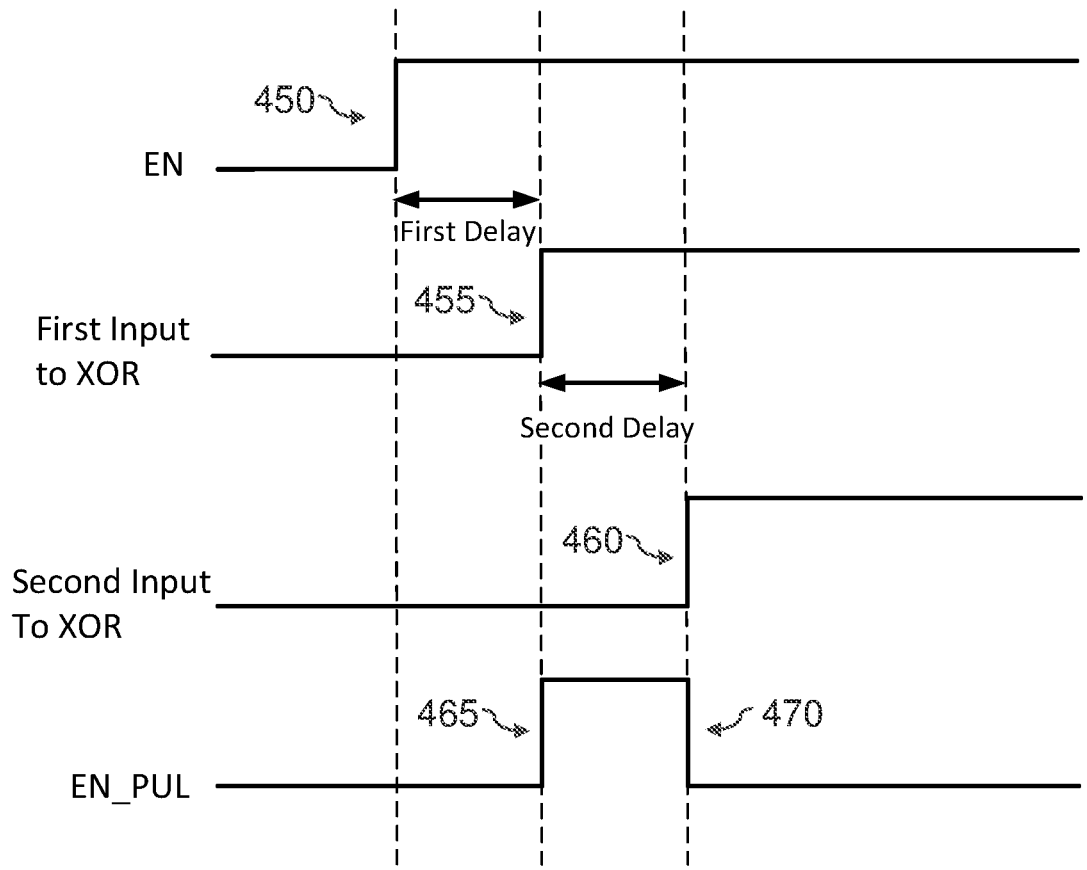
FIG. 4B is a timing diagram showing exemplary signals related to the pulse generator of FIG. 4A according to certain aspects of the present disclosure.

Exemplary operations of the pulse generator 250 will now be described according to certain aspects with reference to FIG. 4B. FIG. 4B is a timing diagram showing exemplary signals related to the pulse generator 250. In this example, the pulse generator 250 receives the enable signal EN at the input 252, in which the enable signal EN transitions from zero to one to enable the ring oscillator 205. The first delay circuit 430 delays the enable signal EN by a first delay. As a result, the rising edge 455 at the first input 412 of the exclusive OR gate 410 is delayed from the rising edge 450 of the enable signal EN by the first delay. The rising edge 455 at the first input 412 of the exclusive OR gate 410 causes the output 416 of the exclusive OR gate 410 to transition from zero to one, resulting in the rising edge 465 of the pulse signal EN_PUL.

The rising edge 460 at the second input 414 is delayed by an additional time delay due to the delay of the second delay circuit 435. Thus, the delay between the rising edge 460 at the second input 414 of the exclusive OR gate 410 and the rising edge 455 at the first input 412 of the exclusive OR gate 410 is approximately equal to the delay of the second delay circuit 435 (labeled "second delay"). During the time between the rising edge 455 at the first input 412 and the rising edge 460 at the second input 414, the output 416 of the exclusive OR gate 410 is one. This is because the logic values at the first input 412 and the second input 414 are different during this time (i.e., the logic value at the first input 412 is one and the logic value at the second input 414 is zero during this time). When the rising edge 460 arrives at the second input 414 of the exclusive OR gate 410, the output 416 of the exclusive OR gate 410 transitions from one to zero, resulting in the falling edge 470 of the pulse signal EN_PUL. Thus, in this example, the width of the pulse signal EN_PUL is approximately equal to the delay of the second delay circuit 435.

In the example in FIG. 4B, the pulse signal EN_PUL is delayed from the rising edge 450 of the enable signal EN by approximately the delay of the first delay circuit 430. The pulse signal EN_PUL may be delayed, for example, to help ensure that the flip-flop 210-1 is released from the reset state in response to the enable signal EN before the pulse signal EN_PUL arrives at the clock input CLK of flip-flop 210-1.

Figure 5:
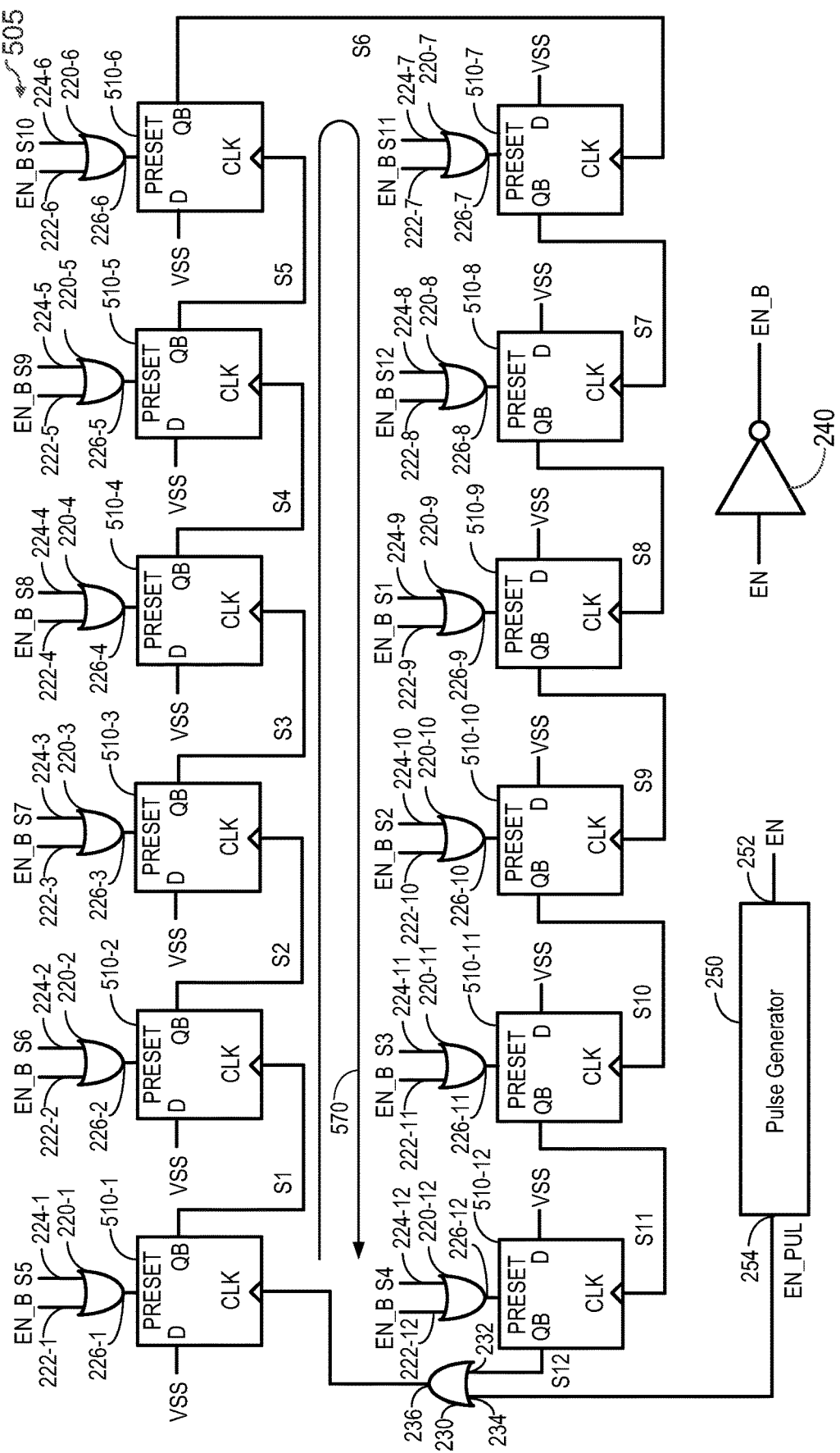
FIG. 5 shows another example of a sequential based ring oscillator according to certain aspects of the present disclosure.

FIG. 5 shows another example of a sequential based ring oscillator 505 according to certain aspects of the present disclosure. The sequential based ring oscillator 505 may be obtain by replacing the flip-flops 210-1 to 210-12 in the ring oscillator 205 in FIG. 2 with flip-flops 510-1 to 510-12.

In this example, each flip-flop 510-1 to 510-12 has a data input (labeled "D"), a clock input (labeled "CLK"), an output (labeled "QB"), and a preset input (labeled "PRESET"). Each flip-flop 510-1 to 510-12 is configured to latch the logic value at the respective data input D in response to a rising edge at the respective clock input CLK and output the inverse of the latched logic value at the respective output QB. In this example, the time delay between a rising edge at the clock input CLK of a flip-flop and the appearance of the corresponding inverted latched logic value at the respective output QB is referred to as the clock-to-QB delay. As discussed further below, the ring oscillator 205 may be used to measure the clock-to-QB delays (e.g., average clock-to-QB delay) of the flip-flops 510-1 to 510-12.

In this example, the clock input CLK of each flip-flop 510-1 to 510-12 is a positive-edge-triggered clock input, and the output QB of each flip-flop 510-1 to 510-12 is an inverting output in that the latched logic value is inverted at the output QB. It is to be appreciated that an inverting output may also be represented by Q. In the example in FIG. 5, the data input D of each flip-flop 510-1 to 510-12 is coupled to a ground line VSS, which corresponds to a logic zero. As a result, each flip-flop 510-1 to 510-12 latches a zero in response to a rising edge at the respective clock input CLK, and outputs the inverse of the latched zero (i.e., one) at the respective output QB.

Each flip-flop 510-1 to 510-12 is configured to preset the respective output QB to zero when a one is input to the respective preset input. This is because the output QB is an inverting output and is therefore zero in the preset state. Each flip-flop 510-1 to 510-12 is configured to de-assert (i.e., release) the preset state when a zero is input to the respective preset input.

In the example in FIG. 5, the output QB of each flip-flop 510-1 to 510-12 is coupled to the clock input CLK of an adjacent flip-flop 510-1 to 510-12 in the ring oscillator 505. The output QB of flip-flop 510-12 is coupled to the clock input CLK of flip-flop 510-1 via the logic gate 230 to close the loop of the ring oscillator 505. Although twelve flip-flops 510-1 to 510-12 are shown in the example in FIG. 5, it is to be appreciated that the present disclosure is not limited to this example. In general, the ring oscillator 505 includes N number of flip-flops coupled in a loop.

The ring oscillator 505 may also include the logic gate 230, the pulse generator 250, and the inverter 240. The logic gate 230, the pulse generator 250, and the inverter 240 are described above with reference to FIG. 2. As discussed above, the logic gate 230 may be implemented with an OR gate. In the example in FIG. 5, the first input 232 of the logic gate 230 is coupled to the output QB of flip-flop 510-12 and the output 236 of the logic gate 230 is coupled to the clock input CLK of flip-flop 510-1. The second input 234 of the logic gate 230 is coupled to the output 254 of the pulse generator 250. As discussed above, the pulse generator 250 is configured to generate a pulse signal EN_PUL in response to a rising edge of the enable signal EN, and the inverter 240 is configured to generate the enable signal EN_B, which is the complement of the enable signal EN.

In the example in FIG. 5, the ring oscillator 505 also includes the logic gates 220-1 to 220-12. Each logic gate 220-1 to 220-12 has a first input 222-1 to 222-12, a second input 224-1 to 224-12, and an output 226-1 to 226-12. The output 226-1 to 226-12 of each logic gate 220-1 to 220-12 is coupled to the preset input of a respective one of the flip-flops 510-1 to 510-12. The first input 222-1 to 222-12 of each logic gate 220-1 to 220-12 is coupled to the output 244 of the inverter 240 to receive the enable signal EN_B. In the example in FIG. 5, each logic gate 220-1 to 220-12 is implemented with an OR gate.

In FIG. 5, the outputs of the flip-flops 510-1 to 510-12 are labeled S1 to S12, respectively. In this example, the output S1 to S12 of each flip-flop 510-1 to 510-12 is coupled to the preset input of a respective non-adjacent flip-flop 510-1 to 510-12 via the second input 224-1 to 224-12 of the corresponding logic gate 220-1 to 220-12. For example, the output S5 of flip-flop 510-5 is coupled to the preset input of respective non-adjacent flip-flop 510-1 via the second input 224-1 of logic gate 220-1, the output S6 of flip-flop 510-6 is coupled to the preset input of respective non-adjacent flip-flop 510-2 via the second input 224-2 of logic gate 220-2, and so forth. In the example in FIG. 5, the output S1 to S12 of each flip-flop 510-1 to 510-12 is separated from the respective non-adjacent flip-flop by three other flip-flops in the loop of the ring oscillator 505. For example, the output S5 of flip-flop 510-5 is separated from the respective non-adjacent flip-flop 510-1 by flip-flops 510-2 to 510-4, the output S6 of flip-flop 510-6 is separated from the respective non-adjacent flip-flop 510-2 by flip-flops 510-3 to 510-5, and so forth.

Exemplary operations of the ring oscillator 505 will now be described according to certain aspects.

The ring oscillator 505 is disabled when the enable signal EN is zero. In this case, the enable signal EN_B output by the inverter 240 to the logic gates 220-1 to 220-12 is one. This causes each logic gate 220-1 to 220-12 to output a one to the preset input of the respective flip-flop 510-1 to 510-12. As a result, each flip-flop 510-1 to 510-12 is in the preset state and outputs a zero at the respective output QB.

To enable the ring oscillator 505, the enable signal EN is asserted in which the enable signal EN transitions from zero to one and the enable signal EN_B transitions from one to zero. The transition of the enable signal EN_B to zero causes each logic gate 220-1 to 220-12 to output a zero to the preset input of the respective flip-flop 510-1 to 510-12. As a result, the preset state at each flip-flop 510-1 to 510-12 is de-asserted (i.e., released).

In addition, the pulse generator 250 generates a pulse signal EN_PUL in response to the transition of the enable signal EN from zero to one (i.e., in response to the rising edge of the enable signal EN). The logic gate 230 passes the pulse signal EN_PUL to the clock input CLK of flip-flop 510-1 to trigger oscillation.

Figure 6:
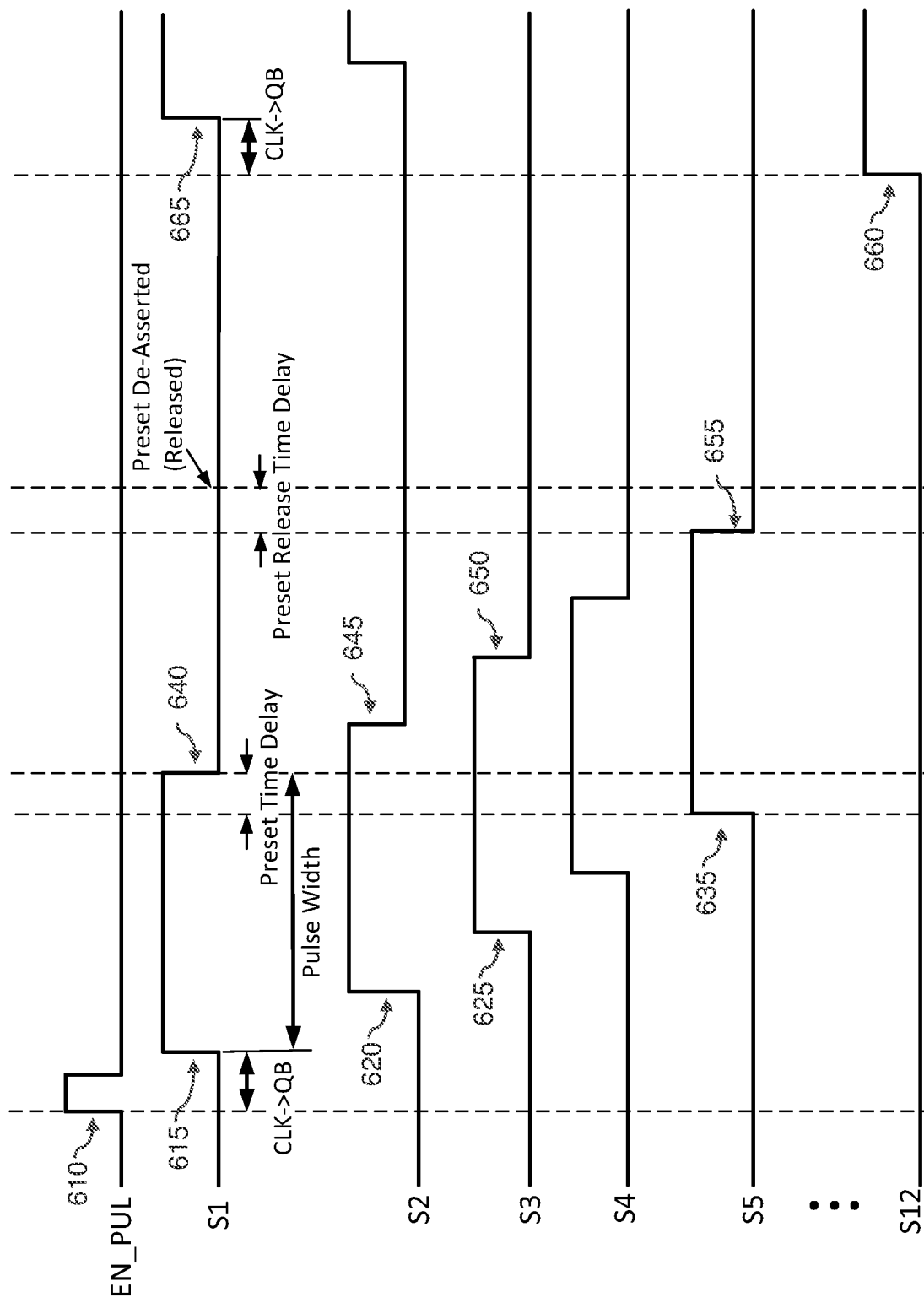
FIG. 6 is a timing diagram showing exemplary signals in the sequential based ring oscillator of FIG. 5 according to certain aspects of the present disclosure.

FIG. 6 is a timing diagram showing an example of the pulse signal EN_PUL at the clock input CLK of flip-flop 510-1. FIG. 6 also shows an example of the output signals S1 to S5 of flip-flops 510-1 to 510-5 and the output signal S12 of flip-flop 510-12. The output signals S6 to S11 of flip-flops 510-6 to 510-11 are not shown in FIG. 6 for ease of illustration.

In this example, the rising edge 610 of the pulse signal EN_PUL causes flip-flop 510-1 to latch the zero (i.e., VSS) at the respective data input D and output the inverse of the latched zero (i.e., one) at the respective output S1 after the clock-to-QB delay of flip-flop 510-1. This produces rising edge 615 at the output S1 of flip-flop 510-1, which is input to the clock input CLK of flip-flop 510-2. The rising edge 615 causes flip-flop 510-2 to latch the zero (i.e., VSS) at the respective data input D and output the inverse of the latched zero (i.e., one) at the respective output S2 after the clock-to-QB delay of flip-flop 510-2. This produces rising edge 620 at the output S2 of flip-flop 510-2, which is input to the clock input CLK of flip-flop 510-3. The rising edge 620 causes flip-flop 510-3 to latch the zero (i.e., VSS) at the respective data input D and output the inverse of the latched zero (i.e., one) at the respective output S3 after the clock-to-QB delay of flip-flop 510-3. This produces rising edge 625 at the output S3 of flip-flop 510-3, which is input to the clock input CLK of flip-flop 510-4. This process continues along the loop of the ring oscillator 505 causing the outputs of the flip-flop 510-1 to 510-12 to sequentially transition from zero to one in the direction 570 indicated in FIG. 5.

The rising edge 635 at the output S5 of flip-flop 510-5 causes flip-flop 510-1 to preset. This is because the output S5 of flip-flop 210-5 is coupled to the preset input of flip-flop 510-1 via the second input 224-1 of logic gate 220-1. In this example, the preset of flip-flop 510-1 causes the output S1 of flip-flop 510-1 to transition from one to zero, resulting in falling edge 640. The falling edge 640 at output S1 is delayed from the rising edge 635 at output S5 by the preset time delay of flip-flop 510-1, as shown in FIG. 6.

The rising edge (not shown) at the output S6 of flip-flop 510-6 causes flip-flop 510-2 to preset, resulting in falling edge 645 at the output S2 of flip-flop 510-2. Similarly, the rising edge (not shown) at the output of S7 of flip-flop 510-7 causes flip-flop 510-3 to preset, resulting in falling edge 650 at the output S3 of flip-flop 510-3. This process continues along the loop of the ring oscillator 505 causing the outputs of the flip-flop 510-1 to 510-12 to sequentially transition from one to zero in the direction 570. Thus, the preset inputs of the flip-flops 510-1 to 510-12 are used to generate the falling edges in the ring oscillator 505.

The falling edge 655 at the output S5 of flip-flop 510-5 causes flip-flop 510-1 to de-assert (i.e., release) the preset state after a preset release time delay of flip-flop 510-1. The release of the preset state prepares flip-flop 510-1 for the next rising edge at the respective clock input CLK. In this example, the next rising edge comes from the rising edge 660 at the output of S12 of flip-flop 510-12, which is passed to the clock input CLK of flip-flop 510-1 by the logic gate 230. The rising edge 660 causes flip-flop 510-1 to latch the zero (i.e., VSS) at the respective data input D and output the inverse of the latched zero (i.e., one) at the respective output S1 after the clock-to-QB delay of flip-flop 510-1. This produces rising edge 665 at the output S1 of flip-flop 510-1, which is input to the clock input CLK of flip-flop 510-2.

The above process repeats while the enable signal EN is high causing the output of each flip-flop 510-1 to 510-12 to oscillate. In this example, the clock inputs CLK of the flip-flops 510-1 to 510-12 are used to generate rising edges (i.e., rise transitions) in the ring oscillator 505 during oscillation and the preset inputs of the flip-flops 510-1 to 510-12 are used to generate falling edges (i.e., fall transitions) in the ring oscillator 505 during oscillation. In this example, oscillation of the ring oscillator 505 is triggered by the pulse signal EN_PUL. Once triggered by the pulse signal EN_PUL, the ring oscillator 505 may continue to oscillate while the enable signal EN is high.

The oscillation frequency of the ring oscillator 505 depends on the clock-to-QB delays of the flip-flops 510-1 to 510-12. Thus, an average of the clock-to-QB delays of the flip-flops 510-1 to 510-12 may be measured by measuring the oscillation frequency of the ring oscillator 505. The oscillation frequency of the ring oscillator 505 may be measured, for example, using a frequency counter, as discussed further below.

In the example in FIG. 5, the output of each flip-flop 510-1 to 510-12 is separated from the preset input of the respective non-adjacent flip-flop by three other flip-flops in the loop path of the ring oscillator 505. However, it is to be appreciated that the present disclosure is not limited to this example. In certain aspects, the output of each flip-flop may be separated from the preset input of the respective non-adjacent flip-flop by two or more other ones of the flip-flops in the ring oscillator 505.

In certain aspects, the duty cycle of the ring oscillator 505 may be set to a duty cycle of less than 50% to help ensure that each flip-flop 510-1 to 510-12 is released from the preset state before the next rising edge at the respective clock input CLK. This may be achieved, for example, by choosing the number of flip-flops separating the output of each flip-flop from the preset input of the respective non-adjacent flip-flop to be less than N/2 (e.g., approximately equal to N/3), where N is the number of flip-flops 510-1 to 510-12 in the ring oscillator 505.

It is to be appreciated that a flip-flop may have both a non-inverting output Q and an inverting output QB. For example, each flip-flop 210-1 to 210-12 in the exemplary ring oscillator 205 may also have an inverting output QB (not shown), which is not used in the loop path of the ring oscillator 205. Similarly, each flip-flop 510-1 to 510-12 in the exemplary ring oscillator 505 may also have a non-inverting output Q (not shown), which is not used in the loop path of the ring oscillator 505.

Figure 7:
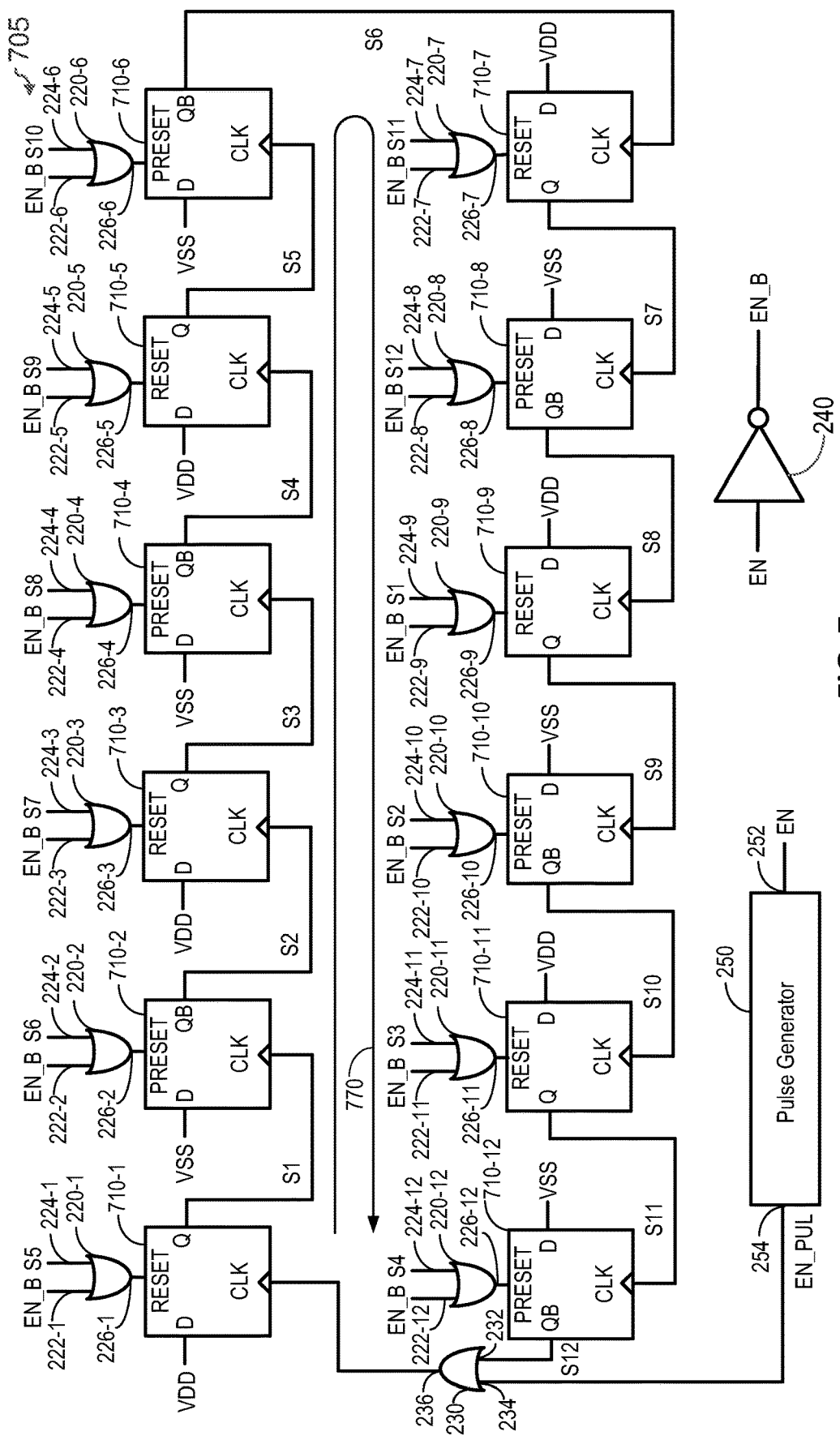
FIG. 7 shows yet another example of a sequential based ring oscillator according to certain aspects of the present disclosure.

FIG. 7 shows another example of a sequential based ring oscillator 705 according to certain aspects of the present disclosure. The sequential based ring oscillator 705 includes multiple flip-flops 710-1 to 710-12 coupled in a loop, in which each flip-flop in a first subset of the flip-flops 710-1 to 710-12 is configured to latch (i.e., capture) a zero and each flip-flop in a second subset of the flip-flops 710-1 to 710-12 is configured to latch (i.e., capture) a one.

In this example, each flip-flop in the first subset of the flip-flops 710-1 to 710-12 has a data input (labeled "D"), a clock input (labeled "CLK"), a non-inverting output (labeled "Q"), and a reset input (labeled "RESET"). The data input D of each flip-flop in the first subset is coupled to a supply voltage line VDD (i.e., one), and is configured to latch the one at the respective data input D in response to a rising edge at the respective clock input CLK and output the latched one at the respective output Q. Each flip-flop in the first subset is configured to reset the respective output Q to zero when a one is input to the respective reset input (i.e., reset is asserted). In the example in FIG. 7, the odd numbered flip-flops 710-1, 710-3, 710-5, 710-7, 710-9 and 710-11 are in the first subset of the flip-flops 710-1 to 710-12. However, it is to be appreciated that the present disclosure is not limited to this example.

In this example, each flip-flop in the second subset of the flip-flops 710-1 to 710-12 has a data input (labeled "D"), a clock input (labeled "CLK"), an inverting output (labeled "QB"), and a preset input (labeled "PRESET"). The data input D of each flip-flop in the second subset is coupled to a ground line VSS (i.e., zero), and is configured to latch the zero at the respective data input D in response to a rising edge at the respective clock input CLK and output the inverse of the latched zero (i.e., one) at the respective output QB. Each flip-flop in the second subset is configured to preset the respective output QB to zero when a one is input to the respective preset input (i.e., preset is asserted). In the example in FIG. 7, the even numbered flip-flops 710-2, 710-4, 710-6, 710-8, 710-10 and 710-12 are in the second subset of the flip-flops 710-1 to 710-12. However, it is to be appreciated that the present disclosure is not limited to this example.

In the example in FIG. 7, the output Q or QB of each flip-flop 710-1 to 710-12 is coupled to the clock input CLK of an adjacent flip-flop 710-1 to 710-12 in the ring oscillator 505. The output QB of flip-flop 710-12 is coupled to the clock input CLK of flip-flop 710-1 via the logic gate 230 to close the loop of the ring oscillator 705. Although twelve flip-flops 710-1 to 710-12 are shown in the example in FIG. 7, it is to be appreciated that the present disclosure is not limited to this example. In general, the ring oscillator 705 includes N number of flip-flops coupled in a loop.

The ring oscillator 705 may also include the logic gate 230, the pulse generator 250, and the inverter 240 discussed above. In the example in FIG. 7, the first input 232 of the logic gate 230 is coupled to the output QB of flip-flop 710-12 and the output 236 of the logic gate 230 is coupled to the clock input CLK of flip-flop 710-1. The second input 234 of the logic gate 230 is coupled to the output 254 of the pulse generator 250. As discussed above, the pulse generator 250 is configured to generate a pulse signal EN_PUL, and the inverter 240 is configured to generate the enable signal EN_B, which is the complement of the enable signal EN.

In the example in FIG. 7, the ring oscillator 505 also includes the logic gates 220-1 to 220-12. Each logic gate 220-1 to 220-12 has a first input 222-1 to 222-12, a second input 224-1 to 224-12, and an output 226-1 to 226-12. The output 226-1 to 226-12 of each logic gate 220-1 to 220-12 is coupled to the reset input or the preset input of a respective one of the flip-flops 710-1 to 710-12. The first input 222-1 to 222-12 of each logic gate 220-1 to 220-12 is coupled to the output 244 of the inverter 240 to receive the enable signal EN_B. In the example in FIG. 7, each logic gate 220-1 to 220-12 is implemented with an OR gate.

In FIG. 7, the outputs of the flip-flops 710-1 to 710-12 are labeled S1 to S12, respectively. In this example, the output S1 to S12 of each flip-flop 710-1 to 710-12 is coupled to the reset input or the preset input of a respective non-adjacent flip-flop 710-1 to 710-12 via the second input 224-1 to 224-12 of the corresponding logic gate 220-1 to 220-12. For example, the output S5 of flip-flop 710-5 is coupled to the reset input of respective non-adjacent flip-flop 710-1 via the second input 224-1 of logic gate 220-1, the output S6 of flip-flop 710-6 is coupled to the preset input of respective non-adjacent flip-flop 710-2 via the second input 224-2 of logic gate 220-2, and so forth. In the example in FIG. 7, the output S1 to S12 of each flip-flop 710-1 to 710-12 is separated from the respective non-adjacent flip-flop by three other flip-flops in the loop of the ring oscillator 705. However, it is to be appreciated that the present disclosure is not limited this example, as discussed further below.

The ring oscillator 705 is disabled when the enable signal EN is zero. In this case, the enable signal EN_B output by the inverter 240 to the logic gates 220-1 to 220-12 is one. This causes each logic gate 220-1 to 220-12 to output a one to the reset input or the preset input of the respective flip-flop 710-1 to 710-12. As a result, each flip-flop in the first subset of the flip-flops 710-1 to 710-12 is in the reset state and outputs a zero at the respective output Q, and each flip-flop in the second subset of the flip-flops 710-1 to 710-12 is in the preset state and outputs a zero at the respective output QB.

To enable the ring oscillator 705, the enable signal EN is asserted in which the enable signal EN transitions from zero to one and the enable signal EN_B transitions from one to zero. The transition of the enable signal EN_B to zero causes each logic gate 220-1 to 220-12 to output a zero to the reset input or the preset input of the respective flip-flop 710-1 to 710-12. As a result, each flip-flop in the first subset of the flip-flops 710-1 to 710-12 is released from the reset state, and each flip-flop in the second subset of the flip-flops 710-1 to 710-12 is released from the preset state.

In addition, the pulse generator 250 generates a pulse signal EN_PUL in response to the transition of the enable signal EN from zero to one (i.e., in response to the rising edge of the enable signal EN). The logic gate 230 passes the pulse signal EN_PUL to the clock input CLK of flip-flop 710-1 to trigger oscillation.

Figure 8:
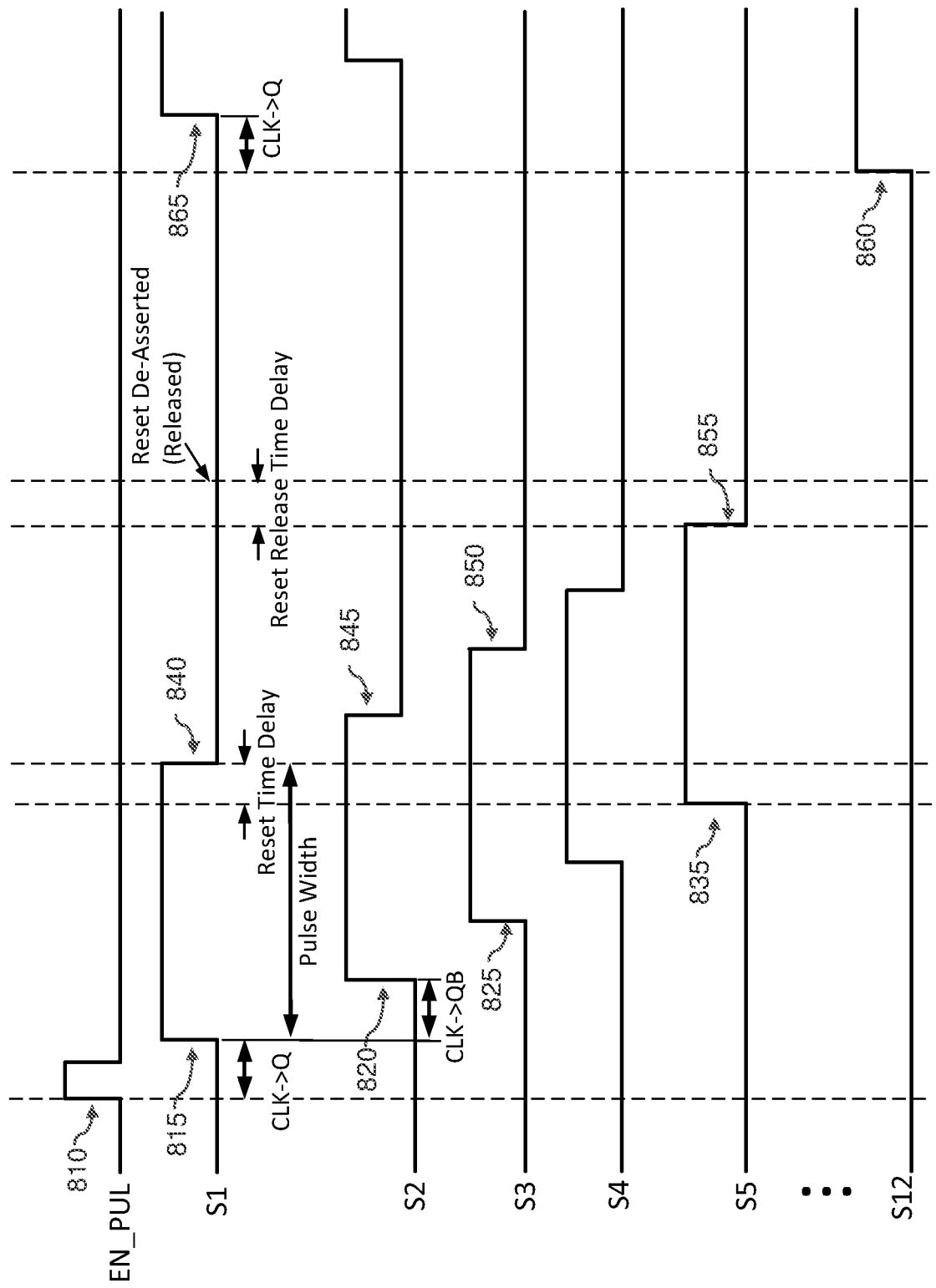
FIG. 8 is a timing diagram showing exemplary signals in the sequential based ring oscillator of FIG. 7 according to certain aspects of the present disclosure.

FIG. 8 is a timing diagram showing an example of the pulse signal EN_PUL at the clock input CLK of flip-flop 710-1. FIG. 8 also shows an example of the output signals S1 to S5 of flip-flops 710-1 to 710-5 and the output signal S12 of flip-flop 710-12. The output signals S6 to S11 of flip-flops 710-6 to 710-11 are not shown in FIG. 8 for ease of illustration.

In this example, the rising edge 810 of the pulse signal EN_PUL causes flip-flop 710-1 to latch the one (i.e., VDD) at the respective data input D and output the latched one at the respective output S1 after the clock-to-Q delay of flip-flop 710-1. This produces rising edge 815 at the output S1 of flip-flop 710-1, which is input to the clock input CLK of flip-flop 710-2. The rising edge 815 causes flip-flop 710-2 to latch the zero (i.e., VSS) at the respective data input D and output the inverse of the latched zero (i.e., one) at the respective output S2 after the clock-to-QB delay of flip-flop 710-2. This produces rising edge 820 at the output S2 of flip-flop 710-2, which is input to the clock input CLK of flip-flop 710-3. The rising edge 820 causes flip-flop 710-3 to latch the one (i.e., VDD) at the respective data input D and output the latched one at the respective output S3 after the clock-to-Q delay of flip-flop 710-3. This produces rising edge 825 at the output S3 of flip-flop 710-3, which is input to the clock input CLK of flip-flop 710-4. This process continues along the loop of the ring oscillator 705 causing the outputs of the flip-flop 710-1 to 710-12 to sequentially transition from zero to one in the direction 770 indicated in FIG. 7.

The rising edge 835 at the output S5 of flip-flop 710-5 causes flip-flop 710-1 to reset. This is because the output S5 of flip-flop 710-5 is coupled to the reset input of flip-flop 710-1 via the second input 224-1 of logic gate 220-1. In this example, the reset of flip-flop 710-1 causes the output S1 of flip-flop 710-1 to transition from one to zero, resulting in falling edge 840.

The rising edge (not shown) at the output S6 of flip-flop 710-6 causes flip-flop 710-2 to preset, resulting in falling edge 845 at the output S2 of flip-flop 710-2. The rising edge (not shown) at the output of S7 of flip-flop 710-7 causes flip-flop 710-3 to reset, resulting in falling edge 850 at the output S3 of flip-flop 710-3. This process continues along the loop of the ring oscillator 705 causing the outputs of the flip-flop 710-1 to 710-12 to sequentially transition from one to zero in the direction 770. Thus, the reset and preset inputs of the flip-flops 710-1 to 710-12 are used to generate the falling edges in the ring oscillator 705 during oscillation.

The falling edge 855 at the output S5 of flip-flop 710-5 causes flip-flop 710-1 to de-assert (i.e., release) the reset state. The release of the reset state prepares flip-flop 710-1 for the next rising edge at the respective clock input CLK. In this example, the next rising edge comes from the rising edge 860 at the output of S12 of flip-flop 710-12, which is passed to the clock input CLK of flip-flop 710-1 by the logic gate 230. The rising edge 860 causes the output Q of flip-flop 710-1 to transition from zero to one producing rising edge 865 at the output S1 of flip-flop 710-1, which is input to the clock input CLK of flip-flop 710-2.

The above process repeats while the enable signal EN is high causing the output of each flip-flop 710-1 to 710-12 to oscillate. In this example, the clock inputs CLK of the flip-flops 710-1 to 710-12 are used to generate rising edges (i.e., rise transitions) in the ring oscillator 205 during oscillation and the reset and preset inputs of the flip-flops 710-1 to 710-12 are used to generate falling edges (i.e., fall transitions) in the ring oscillator 705 during oscillation. In this example, oscillation of the ring oscillator 505 is triggered by the pulse signal EN_PUL. Once triggered by the pulse signal EN_PUL, the ring oscillator 705 may continue to oscillate while the enable signal EN is high.

The oscillation frequency of the ring oscillator 705 may be used to measure an average of the clock-to-Q delays and the clock-to-QB delays of the flip-flops 710-1 to 710-12. The oscillation frequency of the ring oscillator 705 may be measured, for example, using a frequency counter, as discussed further below.

In the example in FIG. 7, the output of each flip-flop 710-1 to 710-12 is separated from the reset input or the preset input of the respective non-adjacent flip-flop by three other flip-flops in the loop path of the ring oscillator 705. However, it is to be appreciated that the present disclosure is not limited to this example. In certain aspects, the output of each flip-flop 710-1 to 710-12 may be separated from the reset input or the preset input of the respective non-adjacent flip-flop by two or more other ones of the flip-flops in the ring oscillator 705.

In certain aspects, the duty cycle of the ring oscillator 705 may be set to a duty cycle of less than 50% to help ensure that each flip-flop 710-1 to 710-12 is released from the reset state or the preset state before the next rising edge at the respective clock input CLK. This may be achieved, for example, by choosing the number of flip-flops separating the output of each flip-flop from the reset input or the preset input of the respective non-adjacent flip-flop to be less than N/2 (e.g., approximately equal to N/3), where N is the number of flip-flops 710-1 to 710-12 in the ring oscillator 705.

In the example in FIG. 7, the ring oscillator 705 alternates between flip-flops that latch ones (e.g., 710-1, 710-3, 710-5, 710-7, 710-9 and 710-11) and flip-flops that latch zeroes (e.g., 710-2, 710-4, 710-6, 710-8, 710-10 and 710-12). However, the present disclosure is not limited to this example. For example, in other implementations, the first N/2 flip-flops in the loop may latch ones and the last N/2 flip-flops in the loop may latch zeroes, or vice versa. Thus, it is to be appreciated that various combinations of flip-flops that latch zeroes and flip-flops that latch ones are possible.

In certain aspects, a sequential based ring oscillator 905 may be built using multi-bit flip-flops (also referred to as flop trays). A multi-bit flip-flop may be configured to latch multiple logic values (e.g., bit values) in parallel on a clock edge (e.g., rising clock edge) and output the latched logic values (e.g., bit values) in parallel.

Figure 9:
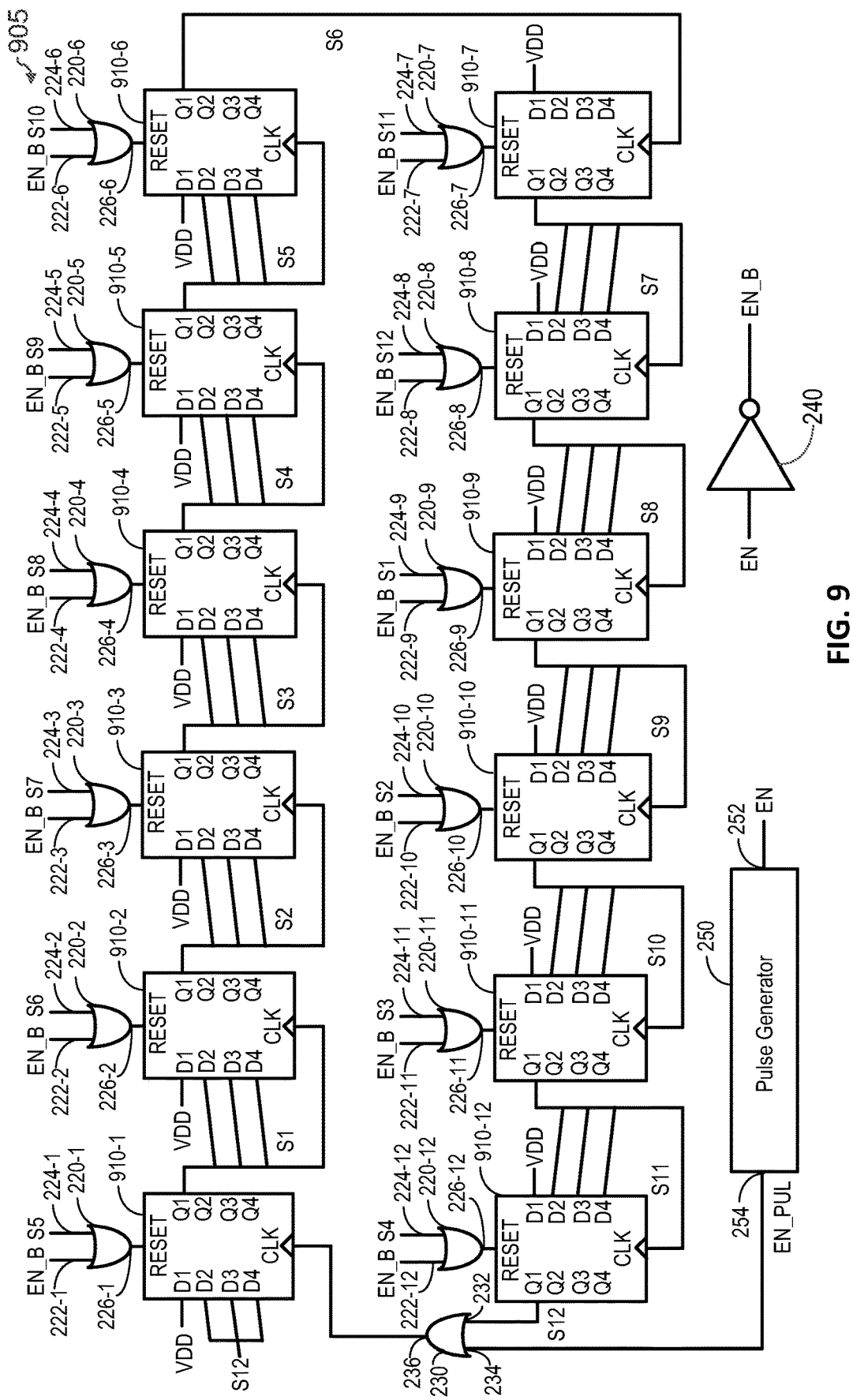
FIG. 9 shows an example of a sequential based ring oscillator including multi-bit flip-flops according to certain aspects of the present disclosure.

FIG. 9 shows an example of a sequential based ring oscillator 905 including multi-bit flip-flops 910-1 to 910-12 coupled in a loop according to certain aspects. In this example, each multi-bit flip-flop 910-1 to 910-12 has multiple data inputs (labeled "D1" to "D4"), a clock input (labeled "CLK"), multiple outputs (labeled "Q1" to "Q4"), and a reset input (labeled "RESET"). Each multi-bit flip-flop 910-1 to 910-12 may be configured to latch the logic values at the respective data inputs D1 to D4 in parallel in response to a rising edge at the respective clock input CLK and output the latched logic values in parallel at the respective outputs Q1 to Q4.

In this example, the first data input D1 of each multi-bit flip-flop 910-1 to 910-12 is coupled to a supply voltage line VDD, which corresponds to a logic one. The other data inputs D2 to D3 of each multi-bit flip-flop 910-1 to 910-12 may be used as loads, as discussed further.

In this example, each multi-bit flip-flop 910-1 to 910-12 is configured to reset the respective outputs Q1 to Q4 to zero when a one is input to the respective reset input. Each multi-bit flip-flop 910-1 to 910-12 is configured to de-assert (i.e., release) the reset when a zero is input to the respective reset input.

In the example in FIG. 9, the first output Q1 of each flip-flop 910-1 to 910-12 is coupled to the clock input CLK of an adjacent flip-flop 910-1 to 910-12 in the ring oscillator 905. In this example, the first output Q1 of flip-flop 910-1 is coupled to the clock input CLK of flip-flop 910-2, the first output Q1 of flip-flop 910-2 is coupled to the clock input CLK of flip-flop 910-3, the first output Q1 of flip-flop 910-3 is coupled to the clock input CLK of flip-flop 910-4, and so forth. The first output Q1 of flip-flop 910-12 is coupled to the clock input CLK of flip-flop 910-1 via a logic gate 230 to close the loop of the ring oscillator 205. In this example, the other outputs Q2 to Q4 of each flip-flop 910-1 to 910-12 are not used in the loop of the ring oscillator 905. Although twelve flip-flops 910-1 to 910-12 are shown in the example in FIG. 9, it is to be appreciated that the present disclosure is not limited to this example. In general, the ring oscillator 905 includes N number of flip-flops.

In this example, the first output Q1 of each flip-flop 910-1 to 910-12 is also coupled to the additional data inputs D2 to D4 of the respective adjacent flip-flop 910-1 to 910-12. Thus, the first output Q1 of each flip-flop 910-1 to 910-12 drives the loads of the additional data inputs D2 of D4 of the respective adjacent flip-flop 910-1 to 910-12. This may be done, for example, the measure the performance of the flip-flops 910-1 to 910-12 under different loading conditions.

The ring oscillator 905 may also include the logic gate 230, the pulse generator 250, and the inverter 240. The logic gate 230, the pulse generator 250, and the inverter 240 are described above with reference to FIG. 2. As discussed above, the logic gate 230 may be implemented with an OR gate. In the example in FIG. 9, the first input 232 of the logic gate 230 is coupled to the first output Q1 of flip-flop 910-12 and the output 236 of the logic gate 230 is coupled to the clock input CLK of flip-flop 910-1. The second input 234 of the logic gate 230 is coupled to the output 254 of the pulse generator 250. As discussed above, the pulse generator 250 is configured to generate a pulse signal EN_PUL in response to a rising edge of the enable signal EN, and the inverter 240 is configured to generate the enable signal EN_B, which is the complement of the enable signal EN.

In the example in FIG. 9, the ring oscillator 905 also includes the logic gates 220-1 to 220-12. Each logic gate 220-1 to 220-12 has a first input 222-1 to 222-12, a second input 224-1 to 224-12, and an output 226-1 to 226-12. The output 226-1 to 226-12 of each logic gate 220-1 to 220-12 is coupled to the reset input of a respective one of the flip-flops 910-1 to 910-12. The first input 222-1 to 222-12 of each logic gate 220-1 to 220-12 is coupled to the output 244 of the inverter 240 to receive the enable signal EN_B. In the example in FIG. 5, each logic gate 220-1 to 220-12 is implemented with an OR gate.

In FIG. 9, the first outputs Q1 of the flip-flops 910-1 to 910-12 are labeled S1 to S12, respectively. In this example, the output S1 to S12 of each flip-flop 910-1 to 910-12 is coupled to the reset input of a respective non-adjacent flip-flop 910-1 to 910-12 via the second input 224-1 to 224-12 of the corresponding logic gate 220-1 to 220-12. For example, the output S5 of flip-flop 910-5 is coupled to the reset input of respective non-adjacent flip-flop 910-1 via the second input 224-1 of logic gate 220-1, the output S6 of flip-flop 910-6 is coupled to the reset input of respective non-adjacent flip-flop 910-2 via the second input 224-2 of logic gate 220-2, and so forth. In the example in FIG. 9, the output S1 to S12 of each flip-flop 910-1 to 910-12 is separated from the respective non-adjacent flip-flop by three other flip-flops in the loop of the ring oscillator 905. However, it is to be appreciated that the present disclosure is not limited to this example. In certain aspects, the output S1 to S12 of each flip-flop 910-1 to 910-12 may be separated from the reset input of the respective non-adjacent flip-flop by two or more other ones of the flip-flops in the ring oscillator 905.

The ring oscillator 905 operates in a similar manner as the ring oscillator 205 in FIG. 2. Therefore, the discussion of the operation of ring oscillator 205 is appliable to the ring oscillator 905. The ring oscillator 905 differs from the ring oscillator 205 in that the output S1 to S12 of each flip-flop 910-1 to 910-12 drives the loads of the additional data inputs D2 to D4 of the respective adjacent flip-flop 910-1 to 910-12, which affects performance. This allows the performance of the flip-flops 910-1 to 910-12 to be measured under different load conditions as well as different process corners.

In the example in FIG. 9, the output S1 to S12 of each flip-flop 910-1 to 910-12 is coupled to three data inputs D2 to D4 of the respective adjacent flip-flop 910-1 to 910-12. However, it is to be appreciated that the present disclosure in not limited to this example. In other examples, the output S1 to S12 of each flip-flop 910-1 to 910-12 may be coupled to one or two of the data inputs D2 to D4 of the respective adjacent flip-flop 910-1 to 910-12. It is also to be appreciated that the flip-flops 910-1 to 910-12 are not limited to the example where each flip-flop has four data inputs D1 to D4 and four outputs Q1 to Q4. In general, each flip-flop 910-1 to 910-12 has k data inputs D1 to Dk and k outputs Q1 to Qk, where k may be less than four, equal to four, or greater than four.

Figure 10:
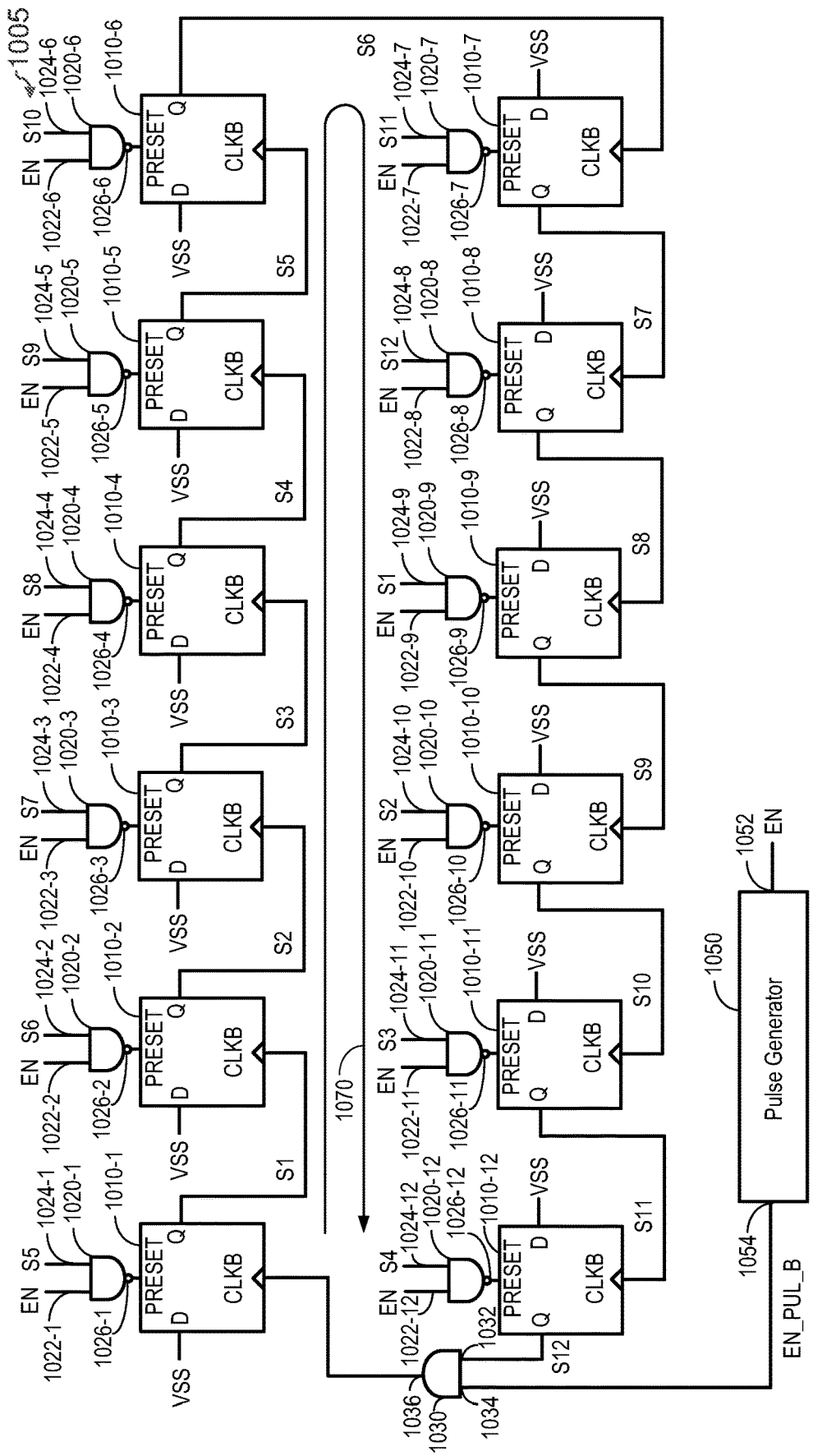
FIG. 10 shows still another example of a sequential based ring oscillator according to certain aspects of the present disclosure.

FIG. 10 shows an example of a sequential based ring oscillator 1005 according to certain aspects of the present disclosure. The sequential based ring oscillator 1005 includes multiple flip-flops 1010-1 to 1010-12 coupled in a loop. In certain aspects, the flip-flops 1010-1 to 1010-12 may be multiple instances of a flip-flop cell defined in a standard cell library.

In this example, each flip-flop 1010-1 to 1010-12 has a data input (labeled "D"), a clock input (labeled "CLKB"), an output (labeled "Q"), and a preset input (labeled "PRESET"). Each flip-flop 1010-1 to 1010-12 is configured to latch the logic value at the respective data input D in response to a falling edge at the respective clock input CLKB and output the latched logic value at the respective output Q. In this example, the time delay between a falling edge at the clock input CLKB of a flip-flop and the appearance of the corresponding latched logic value at the respective output Q is referred to as the clock-to-Q delay. As discussed further below, the ring oscillator 205 may be used to measure the clock-to-Q delays (e.g., average clock-to-Q delay) of the flip-flops 1010-1 to 1010-12.

In this example, the clock input CLKB of each flip-flop 1010-1 to 1010-12 is a negative-edge-triggered clock input in that the flip-flop latches the logic value at the respective data input D on a falling clock edge. In the example in FIG. 10, the data input D of each flip-flop 1010-1 to 1010-12 is coupled to a ground voltage line VSS, which corresponds to a logic zero. As a result, each flip-flop 1010-1 to 1010-12 latches a zero in response to a falling edge at the respective clock input CLKB, and outputs the latched zero at the respective output Q.

Each flip-flop 1010-1 to 1010-12 is configured to preset the respective output Q to one when a one is input to the respective preset input. Each flip-flop 1010-1 to 1010-12 is configured to de-assert (i.e., release) the preset when a zero is input to the respective preset input.

In the example in FIG. 10, the output Q of each flip-flop 1010-1 to 1010-12 is coupled to the clock input CLKB of an adjacent flip-flop 1010-1 to 1010-12 in the ring oscillator 1005. In this example, the output Q of flip-flop 1010-1 is coupled to the clock input CLKB of flip-flop 1010-2, the output Q of flip-flop 1010-2 is coupled to the clock input CLKB of flip-flop 1010-3, the output Q of flip-flop 1010-3 is coupled to the clock input CLKB of flip-flop 1010-4, and so forth. The output Q of flip-flop 1010-12 is coupled to the clock input CLKB of flip-flop 1010-1 via a logic gate 1030 to close the loop of the ring oscillator 1005. Although twelve flip-flops 1010-1 to 1010-12 are shown in the example in FIG. 10, it is to be appreciated that the present disclosure is not limited to this example. In general, the ring oscillator 1005 includes N number of flip-flops coupled in a loop.

The ring oscillator 1005 may also include the logic gate 1030, a pulse generator 1050, and an inverter 1040. The logic gate 1030 has a first input 1032, a second input 1034, and an output 1036. In the example in FIG. 10, the logic gate 1030 is implemented with an AND gate. The first input 1032 of the logic gate 1030 is coupled to the output Q of flip-flop 1010-12 and the output 1036 of the logic gate 1030 is coupled to the clock input CLKB of flip-flop 1010-1. When the ring oscillator 1005 is enabled, the logic gate 1030 passes a falling edge from the output Q of flip-flop 1010-12 to the clock input CLKB of flip-flop 1010-1, as discussed further below.

The pulse generator 1050 has an input 1052 and an output 1054. The input 1052 is configured to receive an enable signal EN and the output 1054 is coupled to the second input 1034 of the logic gate 1030. The pulse generator 1050 is configured to generate a pulse signal EN_PUL_B in response to a rising edge of the enable signal EN and output the generated pulse signal EN_PUL_B at the output 1054.

As discussed further below, the pulse signal EN_PUL_B is a negative pulse used to trigger oscillation of the ring oscillator 1005.

In the example in FIG. 10, the ring oscillator 1005 also includes multiple logic gates 1020-1 to 1020-12. Each logic gate 1020-1 to 1020-12 has a first input 1022-1 to 1022-12, a second input 1024-1 to 1024-12, and an output 1026-1 to 1026-12. The output 1026-1 to 1026-12 of each logic gate 1020-1 to 1020-12 is coupled to the preset input of a respective one of the flip-flops 1010-1 to 1010-12. The first input 1022-1 to 1022-12 of each logic gate 1020-1 to 1020-12 is configured to receive the enable signal EN. In the example in FIG. 10, each logic gate 1020-1 to 1020-2 is implemented with a NAND gate. However, it is to be appreciated that the present disclosure is not limited to this example, as discussed further below.

In FIG. 10, the outputs of the flip-flops 1010-1 to 1010-12 are labeled S1 to S12, respectively. In this example, the output S1 to S12 of each flip-flop 1010-1 to 1010-12 is coupled to the preset input of a respective non-adjacent flip-flop 1010-1 to 1010-12 via the second input 1024-1 to 1024-12 of the corresponding logic gate 1020-1 to 1020-12. For example, the output S5 of flip-flop 1010-5 is coupled to the preset input of respective non-adjacent flip-flop 1010-1 via the second input 1024-1 of logic gate 1020-1, the output S6 of flip-flop 1010-6 is coupled to the preset input of respective non-adjacent flip-flop 1010-2 via the second input 1024-2 of logic gate 1020-2, and so forth. In the example in FIG. 10, the output S1 to S12 of each flip-flop 1010-1 to 1010-12 is separated from the respective non-adjacent flip-flop by three other flip-flops in the loop path of the ring oscillator 1005. However, it is to be appreciated that the present disclosure is not limited to this example.

Exemplary operations of the ring oscillator 1005 will now be described according to certain aspects.

The ring oscillator 1005 is disabled when the enable signal EN is zero. This causes each logic gate 1020-1 to 1020-12 (which is implemented with a NAND gate in this example) to output a one to the preset input of the respective flip-flop 1010-1 to 1010-12. As a result, each flip-flop 1010-1 to 1010-12 is in the preset state and outputs a one at the respective output Q.

To enable the ring oscillator 1005, the enable signal EN is asserted in which the enable signal EN transitions from zero to one. The transition of the enable signal EN to one causes each logic gate 1020-1 to 1020-12 to output a zero to the preset input of the respective flip-flop 1010-1 to 1010-12. As a result, the preset state at each flip-flop 1010-1 to 1010-12 is de-asserted (i.e., released).

In addition, the pulse generator 1050 generates a pulse signal EN_PUL_B in response to the transition of the enable signal EN from zero to one (i.e., in response to the rising edge of the enable signal EN). The pulse signal EN_PUL_B is a negative pulse signal. In contrast, the pulse signal EN_PUL discussed above is a positive pulse signal. The logic gate 1030 passes the pulse signal EN_PUL_B to the clock input CLKB of flip-flop 1010-1 to trigger oscillation.

Figure 11:
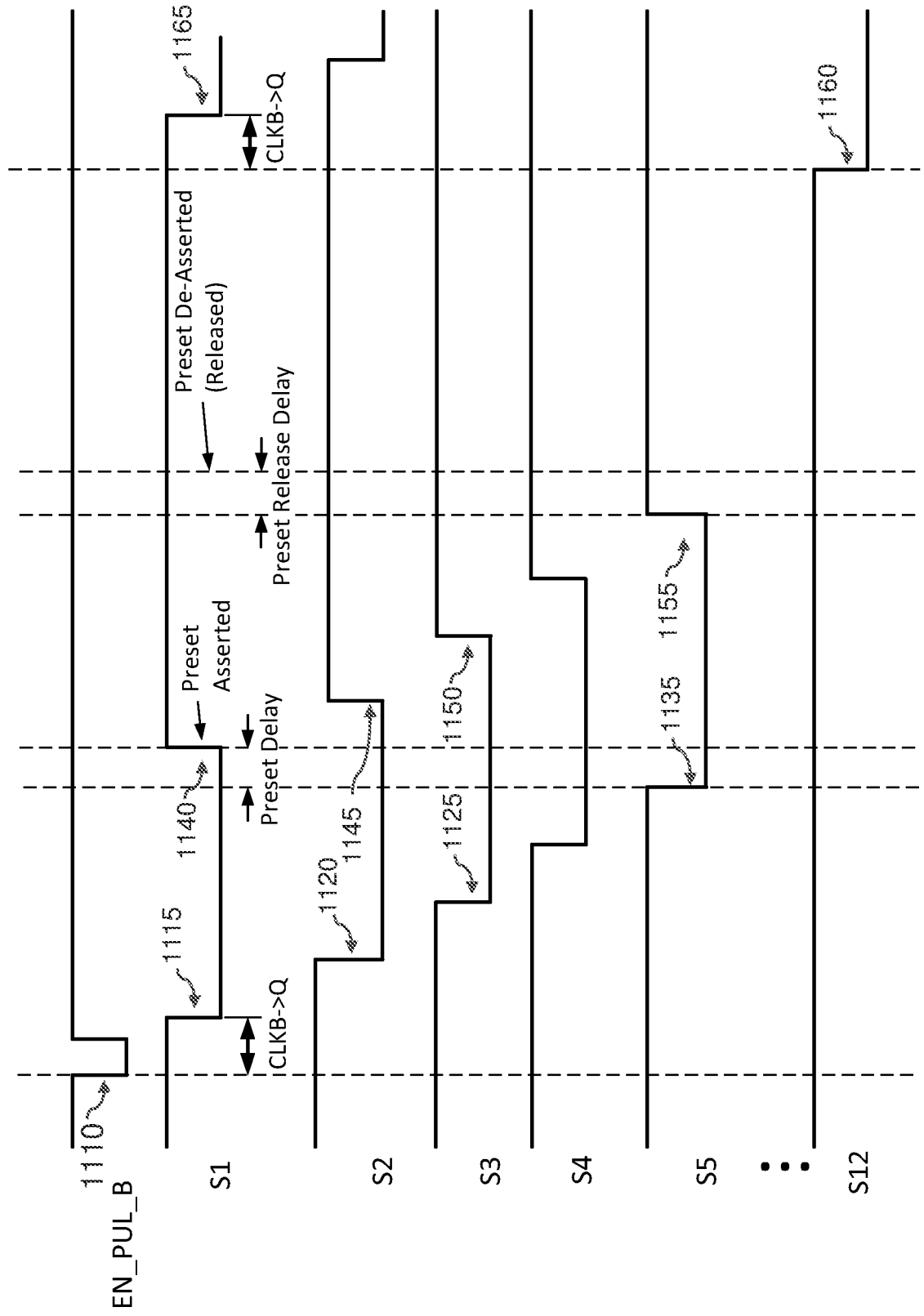
FIG. 11 is a timing diagram showing exemplary signals in the sequential based ring oscillator of FIG. 10 according to certain aspects of the present disclosure.

FIG. 11 is a timing diagram showing an example of the pulse signal EN_PUL_B at the clock input CLKB of flip-flop 1010-1. FIG. 11 also shows an example of the output signals S1 to S5 of flip-flops 1010-1 to 1010-5 and the output signal S12 of flip-flop 1010-12. The output signals S6 to S11 of flip-flops 1010-6 to 1010-11 are not shown in FIG. 11 for ease of illustration.

In this example, the falling edge 1110 of the pulse signal EN_PUL_B causes flip-flop 1010-1 to latch the zero (i.e., VSS) at the respective data input D and output the latched zero at the respective output S1 after the clock-to-Q delay (CLKB->Q) of flip-flop 1010-1. This produces falling edge 1115 at the output S1 of flip-flop 1010-1, which is input to the clock input CLKB of flip-flop 1010-2. The falling edge 1115 causes flip-flop 1010-2 to latch the zero (i.e., VSS) at the respective data input D and output the latched zero at the respective output S2 after the clock-to-Q delay of flip-flop 1010-2. This produces falling edge 1120 at the output S2 of flip-flop 1010-2, which is input to the clock input CLKB of flip-flop 1010-3. The falling edge 1120 causes flip-flop 1010-3 to latch the zero (i.e., VSS) at the respective data input D and output the latched zero at the respective output S3 after the clock-to-Q delay of flip-flop 1010-3. This produces falling edge 1125 at the output S3 of flip-flop 1010-3, which is input to the clock input CLKB of flip-flop 1010-4. This process continues along the loop of the ring oscillator 1005 causing the outputs of the flip-flop 1010-1 to 1010-12 to sequentially transition from one to zero in the direction 1070 indicated in FIG. 10.

The falling edge 1135 of the output signal S5 of flip-flop 1010-5 causes flip-flop 1010-1 to preset. This is because the output signal S5 of flip-flop 1010-5 is coupled to the preset input of flip-flop 1010-1 via the second input 1024-1 of logic gate 1020-1, in which the logic gate 1020-1 inverts the output signal S5 in this example. In this example, the preset of flip-flop 1010-1 causes the output S1 of flip-flop 1010-1 to transition from zero to one, resulting in rising edge 1140. The rising edge 1140 at output S1 is delayed from the falling edge 1135 at output S5 by the preset time delay of flip-flop 1010-1, as shown in FIG. 11.

The falling edge (not shown) at the output S6 of flip-flop 1010-6 causes flip-flop 1010-2 to preset, resulting in rising edge 1145 at the output S2 of flip-flop 1010-2. Similarly, the falling edge (not shown) at the output S7 of flip-flop 1010-7 causes flip-flop 1010-3 to preset, resulting in rising edge 1150 at the output S3 of flip-flop 1010-3. This process continues along the loop of the ring oscillator 1005 causing the outputs of the flip-flop 1010-1 to 1010-12 to sequentially transition from zero to one in the direction 1070. Thus, the preset inputs of the flip-flops 1010-1 to 1010-12 are used to generate rising edges in the ring oscillator 1005, which complement the falling edges generated using the clock inputs CLKB of the flip-flops 1010-1 to 1010-12, enabling the ring oscillator 1005 to oscillate.

The rising edge 1155 at the output S5 of flip-flop 1010-5 causes the preset state at flip-flop 1010-1 to de-assert (i.e., release) after a preset release time delay of flip-flop 1010-1. The release from the preset state prepares flip-flop 1010-1 for the next falling edge at the respective clock input CLKB. In this example, the next falling edge comes from the falling edge 1160 at the output S12 of flip-flop 1010-12. This is because the logic gate 1030 passes the falling edge 1160 at the output S12 of flip-flop 1010-12 to the clock input CLKB of flip-flop 1010-1. The falling edge 1160 causes flip-flop 1010-1 to latch the zero (i.e., VSS) at the respective data input D and output the latched zero at the respective output S1 after the clock-to-Q delay (CLKB->Q) of flip-flop 1010-1. This produces falling edge 1165 at the output S1 of flip-flop 1010-1, which is input to the clock input CLKB of flip-flop 1010-2.

The above process repeats while the enable signal EN is high. This causes the output of each flip-flop 1010-1 to 1010-12 to oscillate while the enable signal EN is high. In this example, the clock inputs CLKB of the flip-flops 1010-1 to 1010-12 are used to generate falling edges (i.e., fall transitions) in the ring oscillator 1005 during oscillation and the preset inputs of the flip-flops 1010-1 to 1010-12 are used to generate rising edges (i.e., rise transitions) in the ring oscillator 1005 during oscillation. In this example, oscillation of the ring oscillator 1005 is triggered by the pulse signal EN_PUL_B. Once triggered by the pulse signal EN_PUL_B, the ring oscillator 1005 may continue to oscillate while the enable signal EN is high.

The oscillation frequency of the ring oscillator 1005 depends on the clock-to-Q (CLKB->Q) delays of the flip-flops 1010-1 to 1010-12. The shorter the clock-to-Q delays, the higher the oscillation frequency of the ring oscillator 1005. Thus, an average of the clock-to-Q delays of the flip-flops 1010-1 to 1010-12 may be measured by measuring the oscillation frequency of the ring oscillator 1005. The oscillation frequency of the ring oscillator 1005 may be measured, for example, using a frequency counter, as discussed further below.

In the example in FIG. 10, the output of each flip-flop 1010-1 to 1010-12 is separated from the preset input of the respective non-adjacent flip-flop by three other flip-flops in the loop path of the ring oscillator 1005. However, it is to be appreciated that the present disclosure is not limited to this example. In certain aspects, the output of each flip-flop may be separated from the preset input of the respective non-adjacent flip-flop by two or more other ones of the flip-flops in the ring oscillator 1005. In certain aspects, the separation between the output of each flip-flop 1010-1 to 1010-12 from the preset input of the respective non-adjacent flip-flop may be less than N/2 (e.g., approximately equal to N/3) to help ensure that each flip-flop 1010-1 to 1010-12 is released from the preset state before the next falling edge at the respective clock input CLKB.

Figure 12A:
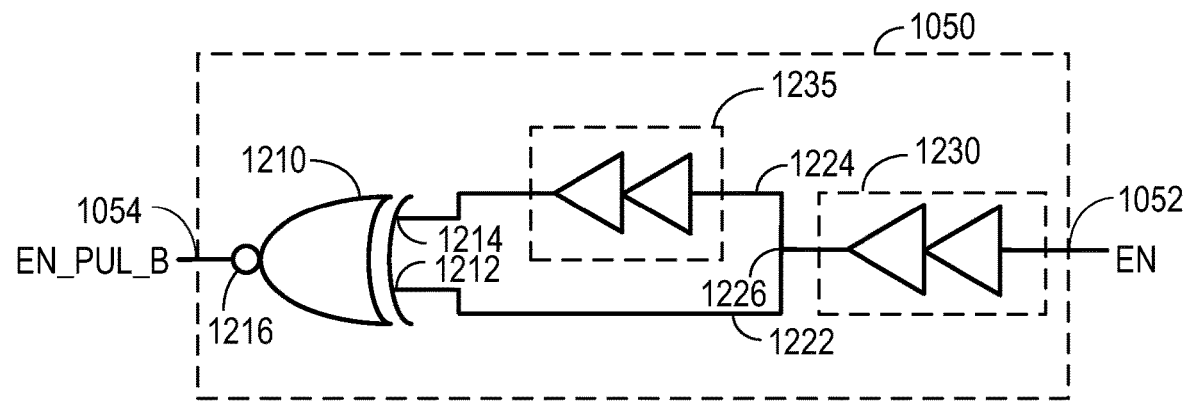
FIG. 12A shows an exemplary implementation of a pulse generator according to certain aspects of the present disclosure.

FIG. 12A shows an exemplary implementation of the pulse generator 1050 according to certain aspects of the present disclosure. In this example, the pulse generator 1050 includes a first delay circuit 1230, a first path 1222, a second path 1224, and an exclusive NOR gate 1210. The exclusive NOR gate 1210 has a first input 1212, a second input 1214, and an output 1216 coupled to the output 1054 of the pulse generator 1050. The first path 1222 is coupled between node 1226 and the first input 1212 of the exclusive NOR gate 1210, and the second path 1224 is coupled between node 1226 and the second input 1214 of the exclusive NOR gate 1210. The first delay circuit 1230 is coupled between the input 1052 of the pulse generator 1050 and node 1226. The first delay circuit 1230 may include one or more delay elements (also referred to as delay buffers).

The second path 1224 includes a second delay circuit 1235 to provide a time delay between the second path 1224 and the first path 1222. The second delay circuit 1235 may include one or more delay elements (also referred to as delay buffers).

Figure 12B:
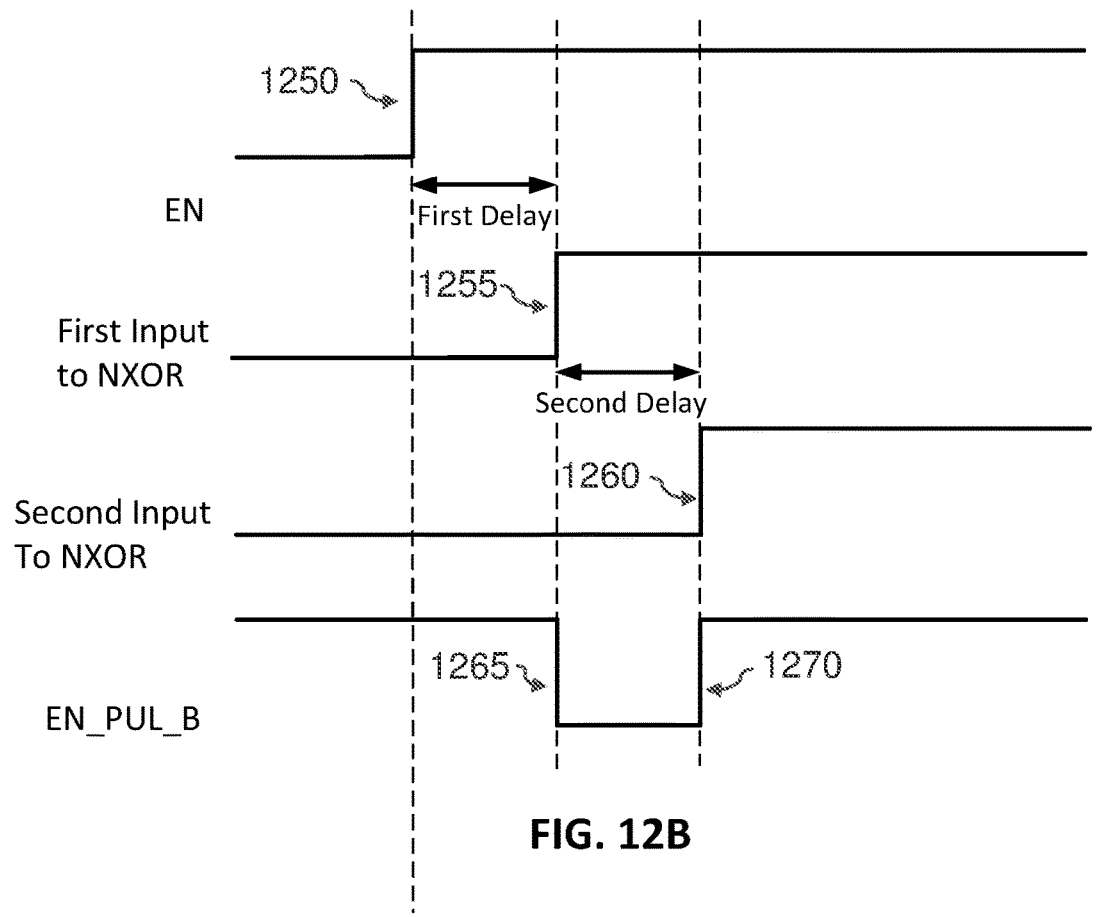
FIG. 12B is a timing diagram showing exemplary signals related to the pulse generator of FIG. 12A according to certain aspects of the present disclosure.

Exemplary operations of the pulse generator 1050 will now be described according to certain aspects with reference to FIG. 12B. FIG. 12B is a timing diagram showing exemplary signals related to the pulse generator 1050. In this example, the pulse generator 1050 receives the enable signal EN at the input 1052, in which the enable signal EN transitions from zero to one to enable the ring oscillator 1005. The first delay circuit 1230 delays the enable signal EN by a first delay. As a result, the rising edge 1255 at the first input 1212 of the exclusive NOR gate 1210 is delayed from the rising edge 1250 of the enable signal EN by the first delay. The rising edge 1255 at the first input 1212 of the exclusive NOR gate 1210 causes the output 1216 of the exclusive NOR gate 1210 to transition from one to zero, resulting in the falling edge 1265 of the pulse signal EN_PUL_B.

The rising edge 1260 at the second input 1214 is delayed by an additional time delay due to the delay of the second delay circuit 1235. Thus, the delay between the rising edge 1260 at the second input 1214 of the exclusive NOR gate 1210 and the rising edge 1255 at the first input 1212 of the exclusive NOR gate 1210 is approximately equal to the delay of the second delay circuit 1235 (labeled "second delay"). During the time between the rising edge 1255 at the first input 1212 and the rising edge 1260 at the second input 1214, the output 1216 of the exclusive NOR gate 1210 is zero. This is because the logic values at the first input 1212 and the second input 1214 are different during this time. When the rising edge 1260 arrives at the second input 1214 of the exclusive NOR gate 1210, the output 1216 of the exclusive NOR gate 1210 transitions from zero to one, resulting in the rising edge 1270 of the pulse signal EN_PUL_B. Thus, in this example, the width of the pulse signal EN_PUL_B is approximately equal to the delay of the second delay circuit 1235.

In the example in FIG. 12B, the pulse signal EN_PUL_B is delayed from the rising edge 1250 of the enable signal EN by the first delay. The pulse signal EN_PUL_B may be delayed, for example, to help ensure that the flip-flop 1010-1 is released from the preset state in response to the enable signal EN before the pulse signal EN_PUL_B arrives at the clock input CLKB of flip-flop 1010-1.

Figure 13:
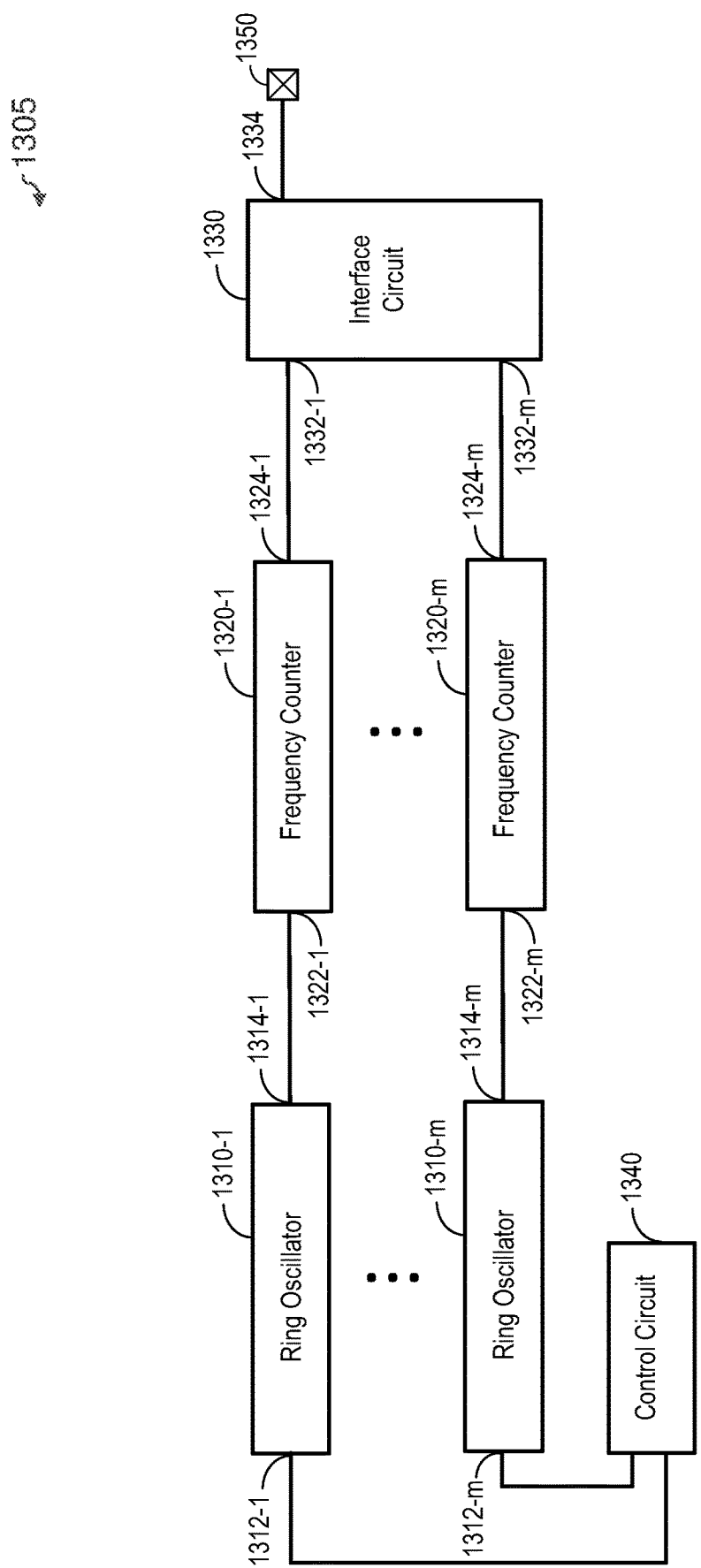
FIG. 13 shows an example of a chip including ring oscillators for process monitoring according to certain aspects of the present disclosure.

FIG. 13 shows an example of a chip 1305 including ring oscillators 1310-1 to 1310-*m* for process monitoring according to certain aspects of the present disclosure. The ring oscillators 1310-1 to 1310-*m* may be distributed across the chip 1305, for example, to monitor local process variation. The ring oscillators 1310-1 to 1310-*m* may be implemented with any one of the exemplary ring oscillators discussed above or any combination of the exemplary ring oscillations discussed above. The ring oscillators 1310-1 to 1310-*m* may be used, for example, to monitor performance variations of one or more standard flip-flop cells due to process variations. Each ring oscillator 1310-1 to 1310-*m* has an enable input 1312-1 to 1312-*m* and an oscillator output 1314-1 to 1314-*m*.

The chip 1305 also includes a control circuit 1340, frequency counters 1320-1 to 1320-*m*, an interface circuit 1330, and a pin 1350 (also referred to as a pad). The control circuit 1340 is coupled to the enable inputs 1312-1 to 1312-*m* of the ring oscillators 1310-1 to 1310-*m*. The control circuit 1340 is configured to selectively enable the ring oscillators 1310-1 to 1310-*m* by generating and controlling the enable signals to the ring oscillators 1310-1 to 1312-*m*. The enable input 1312-1 to 1312-*m* of each ring oscillator 1310-1 to 1310-*m* may be coupled to the input (e.g., input 252 or 1052) of a pulse generator (e.g., pulse generator 250 or 1050) in the ring oscillator and/or coupled to one or more logic gates (e.g., logic gates 220-1 to 220-12 or 1010-1 to 1010-12) in the ring oscillator.

Each frequency counter 1320-1 to 1320-*m* has an input 1322-1 to 1322-*m* and an output 1324-1 to 1324-*m*. The input 1322-1 to 1322-*m* of each frequency counter 1320-1 to 1320-*m* may be coupled to the oscillator output 1314-1 to 1314-*m* of a respective one of the ring oscillators 1310-1 to 1310-*m*. In certain aspects, the oscillator output of a ring oscillator may be coupled to the output of one of the flip-flops in the ring oscillator. In other aspects, the oscillator output of a ring oscillator may include two or more parallel outputs where each of the parallel outputs in coupled to the output of a different one of the flip-flops in the ring oscillator.

In operation, each frequency counter 1320-1 to **1320-*m* is configured to count a number of oscillations at the oscillator output 1324-1 to 1324-*m* of the respective ring oscillator 1310-1 to 1310-*m* within a period of time to generate a count value. The count value of each frequency counter 1320-1 to 1320-*m* provides a measurement of the oscillation frequency of the respective ring oscillator 1310-1 to 1310-*m*. The larger the count value, the higher the oscillation frequency. Each frequency counter 1320-1 to 1320-*m* may output the respective count value at the respective output 1324-1 to 1324-*m***.

The interface circuit 1330 has inputs 1332-1 to **1332-*m* and an output 1334. Each of the inputs 1332-1 to 1332-*m* may be coupled to the output 1324-1 to 1324-*m* of a respective one of the frequency counters 1320-1 to 1320-*m* to receive the respective count value. The interface circuit 1330 may be configured to store the count values from the frequency counters 1320-1 to 1320-*m* in a memory. In certain aspects, the pin 1350 may be coupled to an external test device (i.e., off-chip test device). In these aspects, the interface circuit 1330 may be configured to transmit the count values to the test device via the pin 1350. The test device may collect the count values from chip 1305 and count values from other chips with integrated process monitors (e.g., other instances of the chip 1305**). This information may be used, for example, to evaluate performance variations of one or more standard cells (e.g., flip-flop cells) due to chip-to-chip and/or wafer-to-wafer process variations.

It is to be appreciated that ring oscillators according to aspects of the present disclosure may also be used to measure performance variations with changes in voltage and/or temperature. For example, to measure performance variations with changes in voltage, the supply voltage to one or more ring oscillators (e.g., one or more of ring oscillators 1310-1 to **1310-*m*) may be sequentially set to different voltage levels. In this example, the oscillation frequencies of the one or more ring oscillators may be measured at each one of the voltage levels using one or more frequency counters (e.g., one of more of frequency counters 1320-1 to 1320-*m***). The measured oscillation frequencies at the different voltage levels may be used to evaluate performance variations of the flip-flops in the one or more ring oscillators with changes in voltage.

Ring oscillators according to aspects of the present disclosure may also be used to measure switching and leakage current of flip-flops in one or more ring oscillators. This may be done, for example, by measuring the current supplied to the one or more ring oscillators (e.g., one or more of ring oscillators 1310-1 to **1310-*m***) using one or more current sensors.

It is to be appreciated that the present disclosure is not limited to the example shown in FIG. 13. For example, two or more of the ring oscillators 1310-1 to **1310-*m* may share a frequency counter instead of being coupled to separate frequency counters. In this example, the chip 1305** may include a multiplexer (not shown) configured to couple the two or more ring oscillators to the shared frequency counter one at a time. Thus, a frequency counter may be time multiplexed between multiple ring oscillators.

Figure 14:
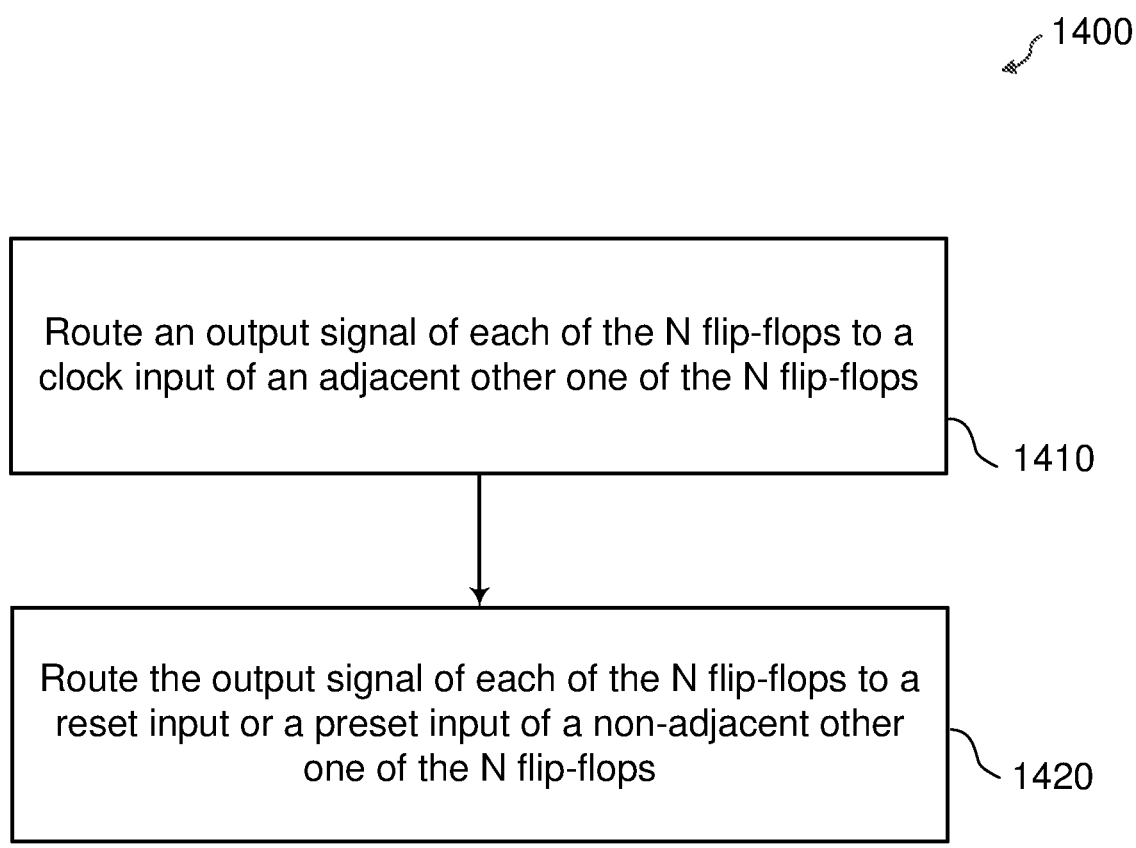
FIG. 14 is a flowchart illustrating a method for measuring performance according to certain aspects of the present disclosure.

FIG. 14 illustrates an exemplary method 1400 for measuring performance using a ring oscillator according to certain aspects of the present disclosure. The ring oscillator (e.g., ring oscillator 205, 505, 705, 905 or 1005) includes N flip-flops (e.g., flip-flops 210-1 to 210-12, 510-1 to 510-12, 710-1 to 710-12, 910-1 to 910-12 or 1010-1 to 1010-12), each of the N flip-flops having a data input coupled to a voltage line (e.g., VDD) or a ground line (e.g., VSS), wherein N is an integer greater than 1.

At block 1410, an output signal of each of the N flip-flops is routed to a clock input of an adjacent other one of the N flip-flops. For example, the output signal of each of the N flip-flops may be routed to the clock input of the adjacent other one of the N flip-flops by coupling an output (e.g., Q or QB) of each of the N flip-flops to the clock input (e.g., CLK) of the adjacent other one of the N flip-flops. In certain aspects, the output signal of a flip-flop (e.g., flip-flop 210-12, 510-12, 710-12, 912-12 or 1010-12) may be routed to the clock input of the respective adjacent flip-flop (e.g., flip-flop 210-1, 510-1, 710-1, 910-1 or 1010-1) via a logic gate (e.g., logic gate 230 or 1030) configured to pass the output signal.

At block 1420, the output signal of each of the N flip-flops is routed to a reset input or a preset input of a non-adjacent other one of the N flip-flops. For example, the output signal of each of the N flip-flops may be routed to the reset input or the preset input of the non-adjacent other one of the N flip-flops by coupling the output (e.g., Q or QB) of each of the N flip-flops to the reset input or the preset input of the non-adjacent other one of the N flip-flops.

The method 1400 may optionally include generating a pulse signal and inputting the pulse signal to the clock input of one of the N flip-flops (e.g., flip-flop 210-1, 510-1, 710-1, 910-1 or 1010-1). This may be done, for example, to trigger oscillation. The pulse signal may be generated by a pulse generator (e.g., pulse generator 250 or 1050). The pulse signal (e.g., EN_PUL or EN_PU_B) may be generated in response to an enable signal (e.g., EN). For example, the pulse signal may be generated in response to a rising edge of the enable signal.

The method 1400 may optionally include measuring an oscillation frequency of the ring oscillator. For example, the oscillation frequency of the ring oscillator may be measured using a frequency counter (e.g., any one of frequency counters 1320-1 to **1320-*m*). In one example, the frequency counter may measure the oscillation frequency of the ring oscillator by counting oscillations at one or more outputs of one or more of the N flip-flops to generate a count value. The count value may be output off the chip via a pin (e.g., pin 1350) by an interface circuit (e.g., interface circuit 1330**).

As used herein, two flip-flops are non-adjacent when the two flip-flops are separated by one or more intervening flip-flops in a ring oscillator.

As used herein, two flip-flops are adjacent when the two flip-flops are not separated by one or more intervening flip-flops in a ring oscillator. It is to be appreciated that an output of a flip-flop may be coupled to the clock input of an adjacent flip-flop in a ring oscillator through a logic gate (e.g., logic gate 230 or 1030) that passes the output signal of the flip-flop to the clock input of the adjacent flip-flop.

It is to be appreciated that a logic gate may include a combination of two or more smaller logic gates. For example, an AND gate may include a combination of a NAND gate and one or more inverters.

It is also be appreciated that, in some implementations, a reset input may be inverting in which the reset state is asserted when the input signal to the reset input is zero (i.e., low) and the reset state is released when the input signal to the reset input is one (i.e., high). Similarly, it is to be appreciated that, in some implementations, a preset input may be inverting.

It is to be appreciated that the present disclosure is not limited to the exemplary terminology used above to describe aspects of the present disclosure. For example, a rising edge may also be referred to as a rise transition, a positive edge, or another term. In another example, a falling edge may also be referred to a fall transition, a negative edge, or another term. A pin may also be referred to as a pad, or another term. A supply voltage line may also be referred to as a supply voltage rail, and a ground line may also be referred to as a ground rail. A reset input may also be referred to as a clear input, and a preset input may also be referred to as a set input.

Any reference to an element herein using a designation such as "first," "second," and so forth does not generally limit the quantity or order of those elements. Rather, these designations are used herein as a convenient way of distinguishing between two or more elements or instances of an element. For example, a first one of the N flip-flops may refer to flip-flop 210-1, 510-1, 710-1, 910-1 or 1010-1 and a second one of the N flip-flops may refer to flip-flop 210-12, 510-12, 710-12, 910-12 or 1010-12. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A ring oscillator, comprising:
    N flip-flops, each of the N flip-flops having a data input, a clock input, and an output, wherein N is an integer greater than 1;
    wherein the output of each of the N flip-flops is coupled to the clock input of an adjacent other one of the N flip-flops;
    wherein the output of each of the N flip-flops is coupled to a reset input or a preset input of a non-adjacent other one of the N flip-flops; and
    wherein the data input of each of the N flip-flops is coupled to a voltage line or a ground line.

2. The ring oscillator of claim 1, wherein the output of each of the N flip-flops is separated from the reset input or the preset input of the respective non-adjacent other one of the N flip-flops by two or more other ones of the N flip-flops.

3. The ring oscillator of claim 1, wherein the output of each of the N flip-flops is separated from the reset input or the preset input of the respective non-adjacent other one of the N flip-flops by less than N/2 other ones of the N flip-flop.

4. The ring oscillator of claim 1, further comprising:
    a logic gate having a first input, a second input, and an output, wherein the output of the logic gate is coupled to the clock input of a first one of the N flip-flops, and the first input of the logic gate is coupled to the output of a second one of the N flip-flops; and
    a pulse generator coupled to the second input of the logic gate.

5. The ring oscillator of claim 4, wherein the logic gate comprises an OR gate.

6. The ring oscillator of claim 4, wherein the logic gate comprises an AND gate.

7. The ring oscillator of claim 4, wherein:
    the pulse generator is configured to generate a pulse signal; and
    the logic gate is configured to pass the pulse signal to the clock input of the first one of the flip-flops.

8. The ring oscillator of claim 7, wherein the pulse signal is a positive pulse signal.

9. The ring oscillator of claim 7, wherein the pulse signal is a negative pulse signal.

10. The ring oscillator of claim 7, wherein the pulse generator is configured to generate the pulse signal in response to an enable signal.

11. The ring oscillator of claim 4, wherein the pulse generator comprises:
    an exclusive OR gate having a first input, a second input, and an output, wherein the output of the exclusive OR gate is coupled to the second input of the logic gate;
    a first path coupled between an input of the pulse generator and the first input of the exclusive OR gate; and
    a second path coupled between the input of the pulse generator and the second input of the exclusive OR gate, the second path including a delay circuit.

12. The ring oscillator of claim 4, wherein the pulse generator comprises:
    an exclusive NOR gate having a first input, a second input, and an output, wherein the output of the exclusive NOR gate is coupled to the second input of the logic gate;
    a first path coupled between an input of the pulse generator and the first input of the exclusive NOR gate; and
    a second path coupled between the input of the pulse generator and the second input of the exclusive NOR gate, the second path including a delay circuit.

13. The ring oscillator of claim 1, wherein:
    each of N flip-flops has one or more additional data inputs; and
    the output of each of the N flip-flops is coupled to the one or more additional data inputs of the respective adjacent other one of the N flip-flops.

14. The ring oscillator of claim 1, wherein the output of each of the N flip-flops is an inverting output.

15. The ring oscillator of claim 1, wherein the output of each of a first subset of the N flip-flops is a non-inverting output, and the output of each of a second subset of the N flip-flops is an inverting output.

16. The ring oscillator of claim 15, wherein the data input of each of the first subset of the N flip-flops is coupled to the voltage line, and the data input of each of the second subset of the N flip-flops is coupled to the ground line.

17. The ring oscillator of claim 1, wherein the clock input of each of the N flip-flops is a positive-edge-triggered clock input.

18. The ring oscillator of claim 1, wherein the clock input of each of the N flip-flops is a negative-edge-triggered clock input.

19. The ring oscillator of claim 1, further comprising:
    logic gates, each of the logic gates have a first input, a second input, and an output;
    wherein the output of each of the logic gates is coupled to the reset input or the preset input of a respective one of the N flip-flops, and the first input of each of the logic gates is configured to receive an enable signal; and wherein the output of each of the N flip-flops is coupled to the reset input or the preset input of the respective non-adjacent other one of the N flip-flops via the second input of a respective one of the logic gates.

20. The ring oscillator of claim 19, wherein each of the logic gates comprises an OR gate.

21. The ring oscillator of claim 20, wherein each of the logic gates comprises a NAND gate.

22. A method for measuring performance using a ring oscillator, wherein the ring oscillator includes N flip-flops, each of the N flip-flops having a data input coupled to a voltage line or a ground line, wherein N is an integer greater than 1, the method comprising:
routing an output signal of each of the N flip-flops to a clock input of an adjacent other one of the N flip-flops; and
routing the output signal of each of the N flip-flops to a reset input or a preset input of a non-adjacent other one of the N flip-flops.

23. The method of claim 22, further comprising:
generating a pulse signal; and
inputting the pulse signal to the clock input of one of the N flip-flops.

24. The method of claim 23, wherein generating the pulse signal comprises generating the pulse signal in response to an enable signal.

25. The method of claim 24, further comprising releasing each of the N flip-flops from a reset state or a preset state in response to the enable signal.

26. The method of claim 22, further comprising measuring an oscillation frequency of the ring oscillator.

27. The method of claim 26, wherein measuring the oscillation frequency of the ring oscillator comprises counting oscillations at one or more outputs of one or more of the N flip-flops to generate a count value.

28. The method of claim 27, wherein the ring oscillator is integrated on a chip, and the method further comprising outputting the count value off the chip.

* * * * *